(12) United States Patent
Gupta et al.

(10) Patent No.: US 12,369,279 B2
(45) Date of Patent: Jul. 22, 2025

(54) NON-PLANAR ANTENNAS FOR PORTABLE STORAGE DEVICES

(71) Applicant: WESTERN DIGITAL TECHNOLOGIES, INC., San Jose, CA (US)

(72) Inventors: Aadesh Gupta, Bengaluru (IN); Sudhan Immanuel G, Bengaluru (IN)

(73) Assignee: Western Digital Technologies, Inc., San Jose, CA (US)

( * ) Notice: Subject to any disclaimer, the term of this patent is extended or adjusted under 35 U.S.C. 154(b) by 171 days.

(21) Appl. No.: 17/957,330

(22) Filed: Sep. 30, 2022

(65) Prior Publication Data
US 2024/0114659 A1    Apr. 4, 2024

(51) Int. Cl.
| | | |
|---|---|---|
| *H05K 7/20* | (2006.01) | |
| *G06F 1/20* | (2006.01) | |
| *H01Q 9/04* | (2006.01) | |
| *H05K 1/02* | (2006.01) | |
| *H05K 3/46* | (2006.01) | |

(52) U.S. Cl.
CPC ........... *H05K 7/2039* (2013.01); *G06F 1/206* (2013.01); *H01Q 9/0407* (2013.01); *H05K 1/0243* (2013.01); *H05K 3/46* (2013.01)

(58) Field of Classification Search
None
See application file for complete search history.

(56) References Cited

U.S. PATENT DOCUMENTS

| | | | |
|---|---|---|---|
| 7,724,193 B2 | 5/2010 | Soora et al. | |
| 7,808,434 B2* | 10/2010 | White | H01Q 1/38 343/895 |
| 9,337,539 B1* | 5/2016 | Ananthanarayanan | H01Q 5/335 |
| 2002/0177335 A1* | 11/2002 | Tsuchioka | G06K 19/077 439/76.1 |
| 2011/0188207 A1* | 8/2011 | Won | H04B 1/036 361/709 |
| 2017/0229763 A1 | 8/2017 | Barak | |
| 2021/0185814 A1 | 6/2021 | Park et al. | |

FOREIGN PATENT DOCUMENTS

CN    111556654    8/2020

* cited by examiner

*Primary Examiner* — Mukundbhai G Patel
(74) *Attorney, Agent, or Firm* — PEARL COHEN ZEDEK LATZER BARATZ LLP

(57) ABSTRACT

A portable storage device is provided that includes a first heat sink and a second heat sink, and a printed circuit board disposed between the first heat sink and the second heat sink. The printed circuit board includes a top side, a bottom side, and a peripheral edge disposed between the top side and the bottom side, and a side-plated antenna disposed on the peripheral edge of the printed circuit board. The side-plated antenna is configured to transmit and receive radio frequency signals.

17 Claims, 25 Drawing Sheets

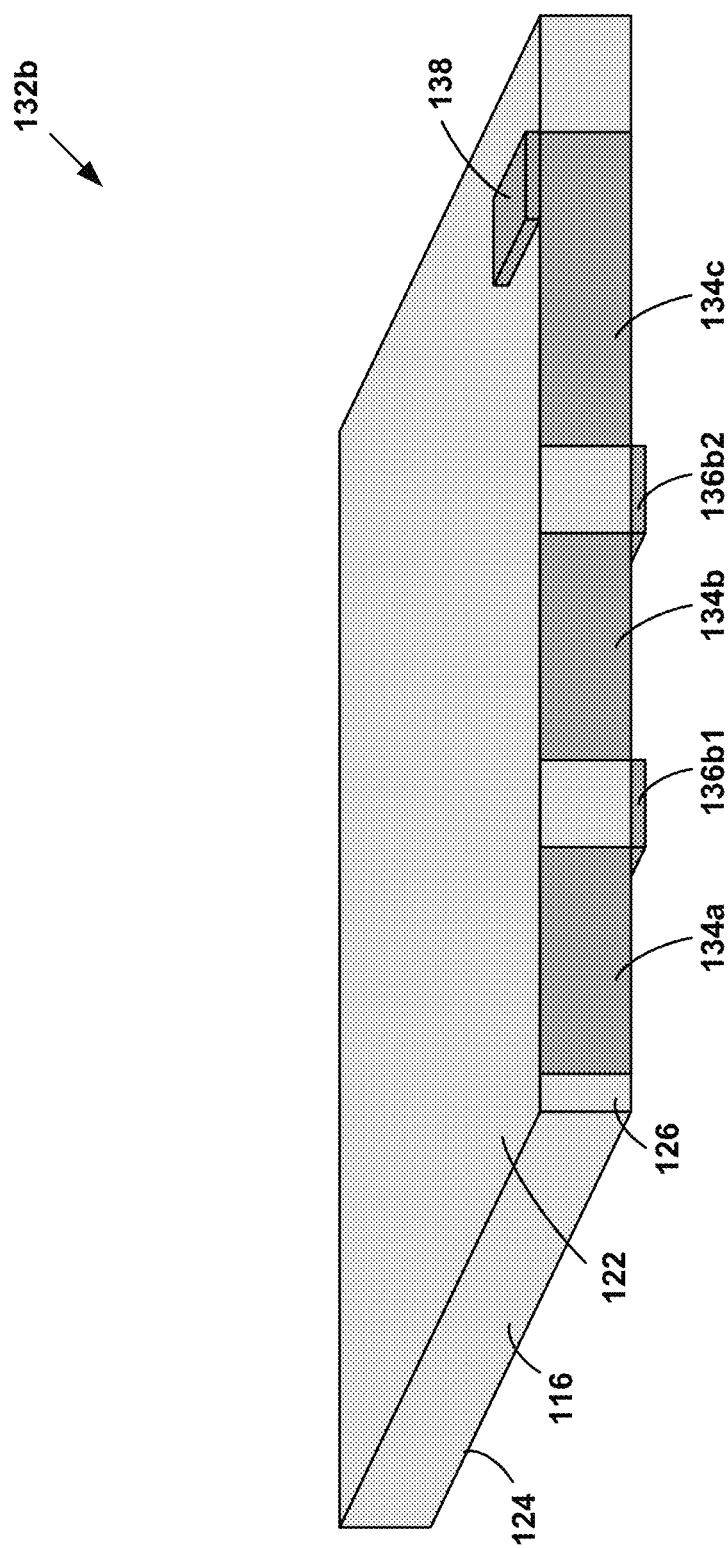

NON-PLANAR ANTENNAS FOR PORTABLE STORAGE DEVICES

BACKGROUND

The strong growth in demand for portable electronics devices is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of portable storage devices, including USB thumb drives and external SSDs (Solid State Drives).

The performance and capabilities of portable storage devices have rapidly increased each year. For example, as technology has evolved portable storage devices have become smaller and faster while increasing storage capacity. In addition, numerous portable storage devices currently implement the USB 3.2 standard, and upcoming portable storage devices will implement the forthcoming USB 4.0 standard.

In addition to the technological advances described above, portable storage devices are also incorporating faster NAND memories. As a result, thermal management of portable storage devices that operate at increasing data rates and include faster NAND memories is challenging. To dissipate excess heat, metal heat sinks are typically used. Indeed, some portable storage devices include numerous metal heat sinks inside the device, and also include metal in the external cases to help dissipate heat.

Next generation portable storage devices may include wireless communication technologies, such as Bluetooth Low Energy (BLE) or other wireless communication technologies. Incorporating wireless communication technologies into portable storage devices requires including an appropriately designed antenna in the devices. Indeed, for BLE technologies an antenna is a critical part of the communication system design. For optimal performance, the antenna should be kept away from metal.

However, as described above the need for thermal management in advanced portable storage devices requires use of heat dissipating techniques, such as metal heat sinks. Thus, incorporating high performance antennas in portable storage devices while also achieving good thermal management presents numerous design challenges.

BRIEF DESCRIPTION OF THE DRAWINGS

Like-numbered elements refer to common components in the different figures.

DETAILED DESCRIPTION

Technology is described for incorporating high performance antennas in portable storage devices that include heat sinks for good thermal management. In embodiments, a printed circuit board in the portable storage device includes a top side, a bottom side, and a peripheral edge disposed between the top side and the bottom side. In embodiments, the printed circuit board is disposed between a first heat sink and a second heat sink. In embodiments, a side-plated antenna is disposed on the peripheral edge of the printed circuit board. The side-plated antenna is configured to transmit and receive radio frequency signals, such as Bluetooth Low Energy, WiFi, UHF and other similar wireless radio frequency signals.

In embodiments, the portable storage device includes a housing that includes a top cover, a bottom cover, and a side portion. In embodiments, the top cover and the bottom cover are metal, and the side portion is non-metallic. In embodiments, the printed circuit board, first heat sink and second heat sink are disposed within the housing. In embodiments, the side-plated antenna is disposed opposite to and in a plane parallel to the side portion of the housing. Without wanting to be bound by any particular theory, it is believed that such a configuration may improve transmission and reception of radio frequency signals by the side-plated antenna, while also achieving good thermal management via the first heat sink and the second heat sink.

Figure 1A:
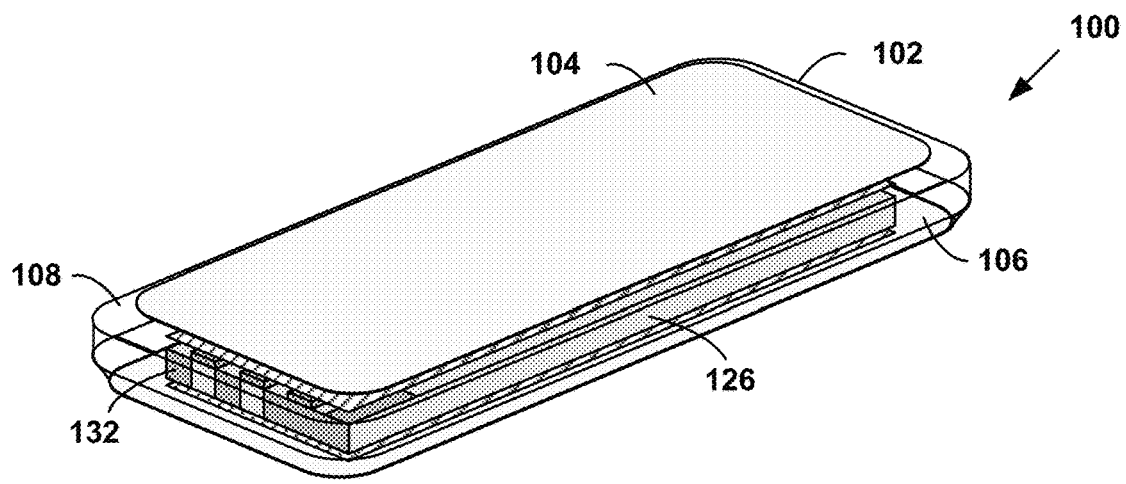
FIG. 1A is a perspective view of portable storage device.
Figure 1B:
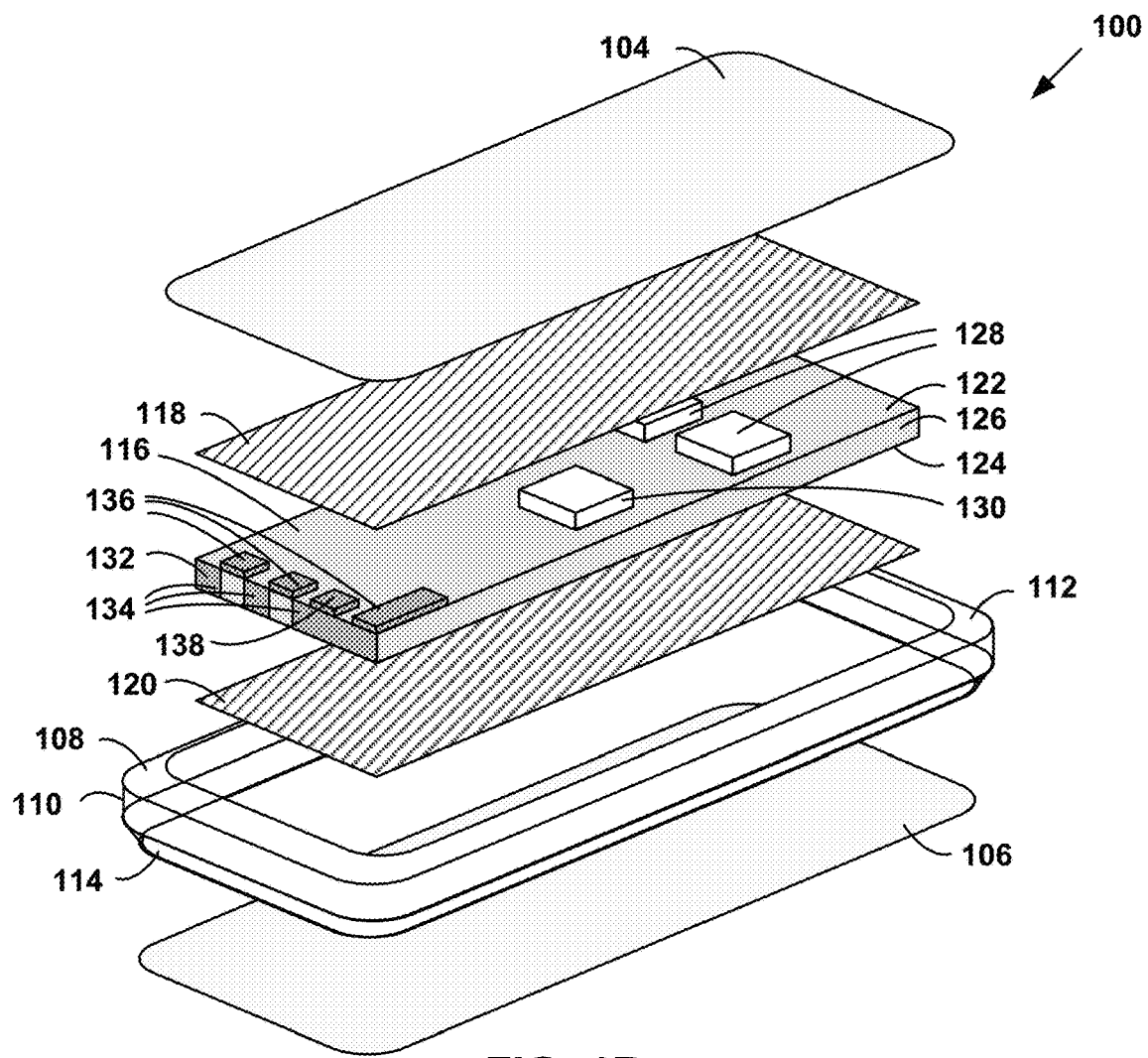
FIG. 1B is an exploded perspective view of the portable storage device of FIG. 1A.

FIGS. 1A and 1B are simplified diagrams of an example portable storage device 100. In particular, FIG. 1A is a perspective view of portable storage device 100, and FIG. 1B is an exploded perspective view of portable storage device 100. In embodiments, portable storage device 100 may be an external SSD or other similar portable storage device.

Portable storage device 100 includes a housing 102 that includes a top cover 104, a bottom cover 106, and a side portion 108. In an embodiment, top cover 104 and bottom cover 106 are fabricated from a metal (e.g., aluminum) and side portion 108 is fabricated from a non-metallic material, such as a plastic material. Persons of ordinary skill in the art will understand that top cover 104 and bottom cover 106 may be fabricated from the same metal or different metals, and may be fabricated from metals other than aluminum. Persons of ordinary skill in the art that one or both of top cover 104 and bottom cover 106 may be fabricated from materials in addition to a metal, and side portion 108 may be fabricated from a material other than a plastic.

In the example depicted in FIGS. 1A-1B, side portion 108 is translucent, although side portion 108 may be fabricated from a non-translucent material. In an embodiment, side portion 108 includes a first portion 110 disposed between a second portion 112 and a third portion 114. In an embodiment, first portion 110 is substantially perpendicular to top cover 104 and bottom cover 106.

In an embodiment, top cover 104 and bottom cover 106 are attached to side portion 108. In an embodiment, top cover 104 and bottom cover 106 are attached to side portion 108 with an adhesive material such as an epoxy glue or other similar material. In an embodiment, top cover 104 is attached to second portion 112 of side portion 108, and bottom cover 106 is attached to third portion 114 of side portion 108.

Persons of ordinary skill in the art will understand that side portion 108 may have feature other than that depicted in FIGS. 1A-1B. In an embodiment, one or both of second portion 112 and third portion 114 may be omitted from side portion 108, which may include only first portion 110. In such an embodiment, top cover 104 and bottom cover 106 each are attached to first portion 110 of side portion 108.

In an embodiment, portable storage device 100 includes a printed circuit board 116 disposed between a first (top) heat sink 118 and a second (bottom) heat sink 120. In an embodiment, printed circuit board 116 includes a top side 122, a bottom side 124, and a peripheral edge 126 disposed between top side 122 and bottom side 124. In an embodiment, top heat sink 118 and bottom heat sink 120 are substantially parallel to one another.

In an embodiment, top side 122 of printed circuit board 116 is substantially parallel to top heat sink 118, bottom side 124 of printed circuit board 116 is substantially parallel to bottom heat sink 120, and peripheral edge 126 is substantially perpendicular to top side 122 and bottom side 124, and substantially parallel to first portion 110 of side portion 108.

In an embodiment, top heat sink 118 includes a first metal material and bottom heat sink 120 includes a second metal material. In an embodiment, top heat sink 118 is fabricated from multiple material layers including the first metal material and one or more non-metal materials. In an embodiment, bottom heat sink 120 is fabricated from multiple material layers including the second metal material and one or more non-metal materials. In an embodiment, the first metal material and the second metal material are different metal materials. In an embodiment, the first metal material and the second metal material are the same metal material.

In an embodiment, top heat sink 118 and bottom heat sink 120 each include copper or some other thermally conductive material or combination of materials. In an embodiment, top heat sink 118 and bottom heat sink 120 may include one or more of a metal, a graphite tape, a thermal interface material, a nano carbon copper tape, a metal sponge or other similar heat sink materials.

In an embodiment, top heat sink 118 and bottom heat sink 120 are configured to dissipate heat generated by electrical components disposed within portable storage device 100. In an embodiment, top heat sink 118 substantially covers an entire area of top side 122 of printed circuit board 116, and bottom heat sink 120 substantially covers an entire area of bottom side 124 of printed circuit board 116.

Persons of ordinary skill in the art will understand that portable storage device 100 may include only one of top heat sink 118 and bottom heat sink 120, or may include additional thermal management materials (including heat sinks) in addition to top heat sink 118 and bottom heat sink 120. Persons of ordinary skill in the art also will understand that portable storage device 100 may include more than one printed circuit board 116, and may include components in addition to or other than those depicted in FIGS. 1A-1B.

In an embodiment, printed circuit board 116 includes various electrical components, such as a memory integrated circuit 128, a radio frequency (RF) communication integrated circuit 130, and other electrical components (not shown). In an embodiment, memory integrated circuit 128 includes non-volatile memory devices such as NAND memory devices. In embodiments, memory integrated circuit 128 may include one or more memory integrated circuit die, packaged or unpackaged.

Persons of ordinary skill in the art will understand that memory integrated circuit 128 may include circuits in addition to or other than non-volatile memory devices. Persons of ordinary skill in the art will understand that printed circuit board 116 may include more than one memory integrated circuit 128.

In an embodiment, memory integrated circuit 128 and RF communication integrated circuit 130 are disposed on the same printed circuit board 116. In an embodiment, portable storage device 100 includes more than one printed circuit board 116, and memory integrated circuit 128 and RF communication integrated circuit 130 are disposed on separate printed circuit boards 116.

In an embodiment, RF communication integrated circuit 130 includes circuits to generate and receive RF signals, such as BLE signals or other RF signals. For example, RF communication integrated circuit 130 may be a TI CC2541 Bluetooth Low Energy and proprietary wireless MCU by Texas Instruments Inc., Dallas TX. In an embodiment, memory integrated circuit 128 and RF communication integrated circuit 130 are separate integrated circuits. In other embodiments, some or all of the functionality of RF communication integrated circuit 130 may be included in memory integrated circuit 128.

In the example of FIGS. 1A-1B, memory integrated circuit 128 and RF communication integrated circuit 130 are disposed on top side 122 of printed circuit board 116. Persons of ordinary skill in the art will understand that one or more of memory integrated circuit 128 and RF communication integrated circuit 130 may be disposed on bottom side 124 of printed circuit board 116.

In an embodiment, printed circuit board 116 also includes a side-plated antenna 132 coupled to RF communication integrated circuit 130 for transmitting RF signals (e.g., BLE signals) generated by RF communication integrated circuit 130, and for receiving RF signals (e.g., BLE signals) to be received by RF communication integrated circuit 130.

In an embodiment, side-plated antenna 132 is disposed on peripheral edge 126 of printed circuit board 116. In an embodiment, side-plated antenna 132 is fabricated by electroplating a conductive material (e.g., copper, nickel, or other similar conductive material) on peripheral edge 126 of printed circuit board 116. In an embodiment, side-plated antenna 132 is disposed in a meander pattern on peripheral edge 126 of printed circuit board 116.

In an embodiment, memory integrated circuit 128, RF communication integrated circuit 130 and side-plated antenna 132 are disposed on the same printed circuit board 116. In an embodiment, memory integrated circuit 128, RF communication integrated circuit 130 and side-plated antenna 132 are disposed on separate printed circuit boards 116.

In an embodiment, side-plated antenna 132 includes one or more first portions 134 disposed on peripheral edge 126 of printed circuit board 116, one or more second portions 136 disposed on top side 122 and/or bottom side 124 of printed circuit board 116, and an RF feed input terminal 138 disposed on top side 122 and/or bottom side 124 of printed circuit board 116.

In an embodiment, first portions 134 are fabricated by electroplating a conductive material (e.g., copper, nickel, or other similar conductive material) on peripheral edge 126 of printed circuit board 116. In an embodiment, second portions 136 and RF feed input terminal 138 are fabricated by forming metallic traces on top side 122 and/or bottom side 124 of printed circuit board 116. Persons of ordinary skill in the art will understand that other techniques may be used to fabricate first portions 134, second portions 136 and RF feed input terminal 138.

In an embodiment, side-plated antenna 132 is disposed in a plane perpendicular to top side 122 and bottom side 124 of printed circuit board 116. In an embodiment, side-plated antenna 132 is disposed in a plane perpendicular to top heat sink 118 and bottom heat sink 120. In an embodiment, side-plated antenna 132 is disposed opposite to and in a plane parallel to first portion 110 of side portion 108.

Without wanting to be bound by any particular theory, it is believed that disposing side-plated antenna 132 on peripheral edge 126 of printed circuit board 116 in a plane perpendicular to top heat sink 118 and bottom heat sink 120 may improve transmission and reception of RF signals (e.g., BLE signals) by antenna 132.

In addition, without wanting to be bound by any particular theory, it is believed that disposing side-plated antenna 132 opposite to and in a plane parallel to first portion 110 of side portion 108 may improve transmission and reception of RF signals (e.g., BLE signals) by side-plated antenna 132.

Moreover, without wanting to be bound by any particular theory, it is believed that disposing side-plated antenna 132 on peripheral edge 126 of printed circuit board 116 in a plane perpendicular to top heat sink 118 and bottom heat sink 120, and opposite to and in a plane parallel to first portion 110 of side portion 108 may provide a portable storage device 100 that incorporates a high performance antenna 132 while also including achieving good thermal management.

Figure 2A:
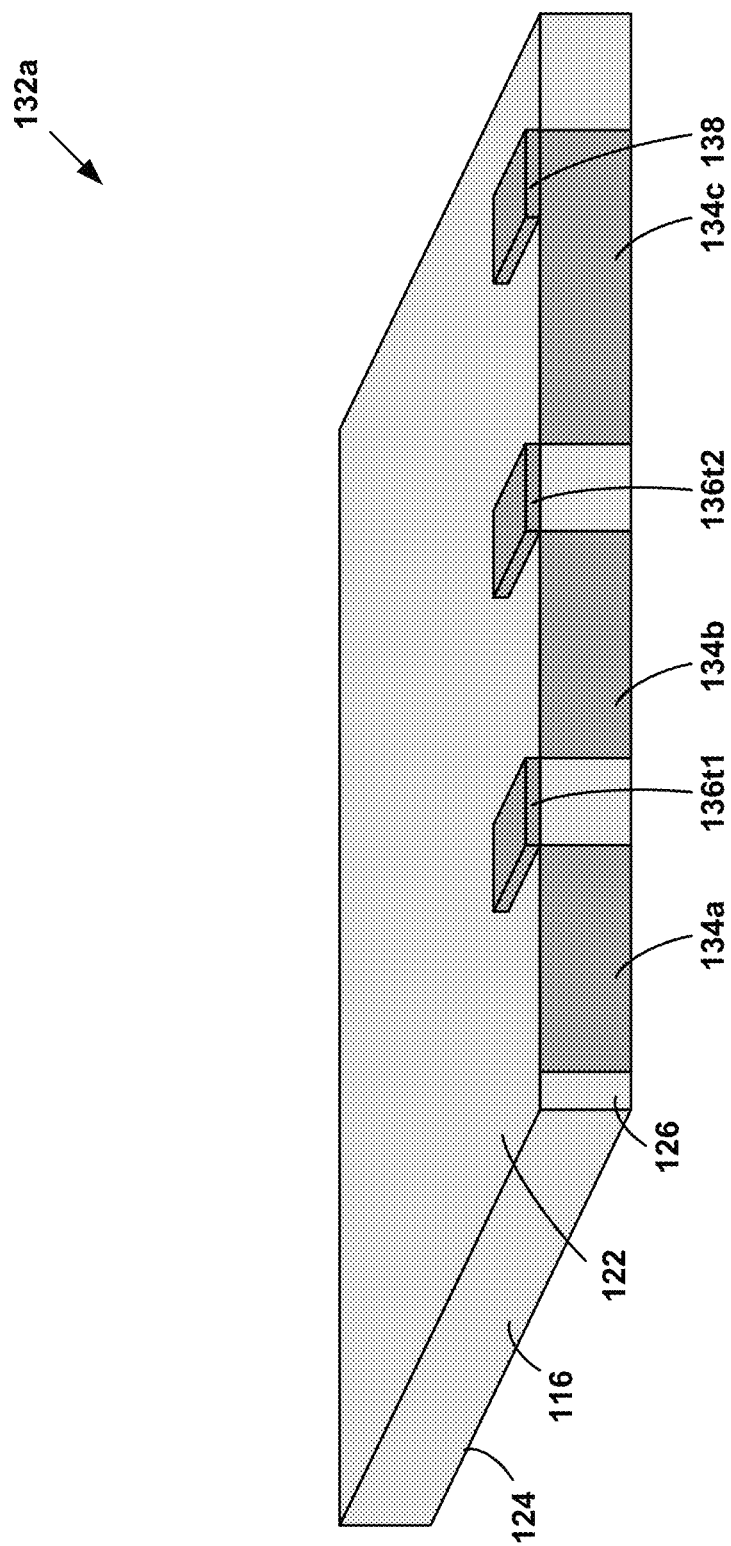
FIGS. 2A-2X depict various example embodiments of side-plated antennas disposed on printed circuit boards.

Side-plated antenna 132 may be implemented using a variety of different forms. For example, FIG. 2A depicts a first example embodiment of a side-plated antenna 132a disposed on printed circuit board 116. Side-plated antenna 132a includes first portions 134a-134c disposed on peripheral edge 126 of printed circuit board 116, second portions 136t1-136t2 disposed on top side 122 of printed circuit board 116, and an RF feed input terminal 138 disposed on top side 122 of printed circuit board 116. Persons of ordinary skill in the art will understand that side-plated antenna 132a may include more or fewer than three first portions 134, and more or fewer than two second portions 136.

In an embodiment, first portions 134a-134c are fabricated by electroplating a metallic material (e.g., copper, nickel, or other similar conductive material) on peripheral edge 126 of printed circuit board 116. In an embodiment, second portions 136t1-136t2 and RF feed input terminal 138 are fabricated by forming conductive traces on top side 122 of printed circuit board 116. Persons of ordinary skill in the art will understand that other techniques may be used to fabricate first portions 134a-134c, second portions 136t1-136t2, and RF feed input terminal 138.

In the example depicted in FIG. 2A, second portion 136t1 is disposed on top side 122 of printed circuit board 116 between first portions 134a and 134b, and second portion 136t2 is disposed on top side 122 of printed circuit board 116 between first portions 134b and 134c. Second portion 136t1 is electrically connected to first portions 134a and 134b, second portion 136t2 is electrically connected to first portions 134b and 134c, and RF feed input terminal 138 is electrically connected to first portion 134c, creating a meander structure side-plated antenna 132a.

Persons of ordinary skill in the art will understand that the lengths and widths of first portions 134a-134c, and second portions 136t1-136t2 can be selected to achieve a desired bandwidth and center frequency for side-plated antenna 132a.

FIG. 2B depicts a second example embodiment of a side-plated antenna 132b disposed on printed circuit board 116. Side-plated antenna 132b is similar to side-plated antenna 132a of FIG. 2A, but includes second portions 136b1-136b2 disposed on bottom side 124 of printed circuit board 116 instead of second portions 136t1-136t2 disposed on top side 122 of printed circuit board 116. Persons of ordinary skill in the art will understand that side-plated antenna 132b may include more or fewer than three first portions 134, and more or fewer than two second portions 136.

In an embodiment, second portions 136b1-136b2 are fabricated by forming conductive traces on bottom side 124 of printed circuit board 116. Persons of ordinary skill in the art will understand that other techniques may be used to fabricate second portions 136b1-136b2.

In the example depicted in FIG. 2B, second portion 136b1 is disposed on bottom side 124 of printed circuit board 116 between first portions 134a and 134b, and second portion 136b2 is disposed on bottom side 124 of printed circuit board 116 between first portions 134b and 134c. Second portion 136b1 is electrically connected to first portions 134a and 134b, second portion 136b2 is electrically connected to first portions 134b and 134c, and RF feed input terminal 138 is electrically connected to first portion 134c, creating a meander structure side-plated antenna 132b.

Persons of ordinary skill in the art will understand that the lengths and widths of first portions 134a-134c, and second portions 136b1-136b2 can be selected to achieve a desired bandwidth and center frequency for side-plated antenna 132b.

Figure 2C:
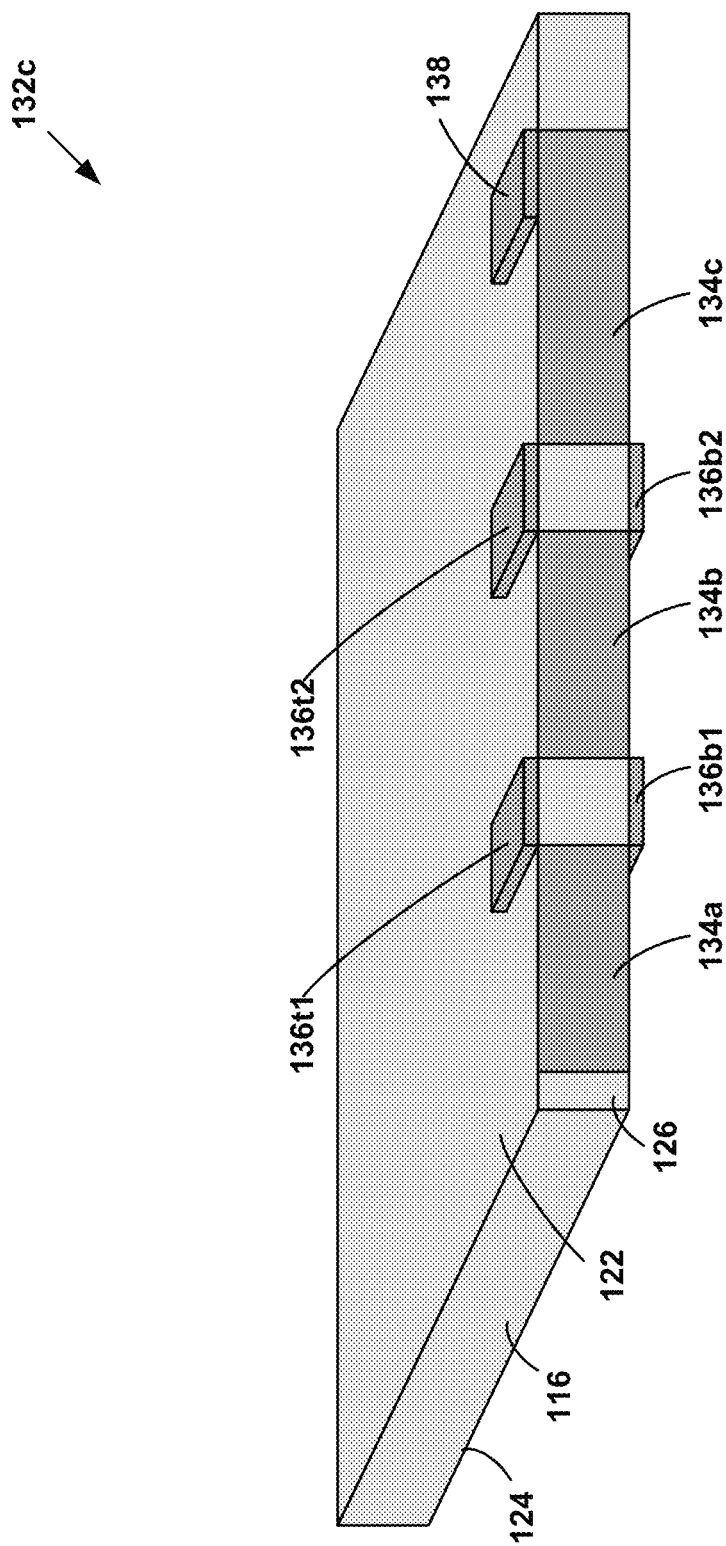

FIG. 2C depicts a third example embodiment of a side-plated antenna 132c disposed on printed circuit board 116. Side-plated antenna 132c has a meander structure and combines the elements of side-plated antenna 132a of FIG. 2A and side-plated antenna 132b of FIG. 2B. In particular, side-plated antenna 132c includes first portions 134a-134c disposed on peripheral edge 126 of printed circuit board 116, second portions 136t1-136t2 disposed on top side 122 of printed circuit board 116, second portions 136b1-136b2 disposed on bottom side 124 of printed circuit board 116, and an RF feed input terminal 138 disposed on top side 122 of printed circuit board 116, all fabricated as described above regarding FIGS. 2A-2B. Persons of ordinary skill in the art will understand that side-plated antenna 132b may include more or fewer than three first portions 134, and more or fewer than four second portions 136.

In the example depicted in FIG. 2C, second portion 136t1 is disposed on top side 122 of printed circuit board 116 between first portions 134a and 134b, and second portion 136t2 is disposed on top side 122 of printed circuit board 116 between first portions 134b and 134c. In addition, second portion 136b1 is disposed on bottom side 124 of printed circuit board 116 between first portions 134a and 134b, and second portion 136b2 is disposed on bottom side 124 of printed circuit board 116 between first portions 134b and 134c.

Second portion 136t1 is electrically connected to first portions 134a and 134b, second portion 136t2 is electrically connected to first portions 134b and 134c, second portion 136b1 is electrically connected to first portions 134a and 134b, second portion 136b2 is electrically connected to first portions 134b and 134c, and RF feed input terminal 138 is electrically connected to first portion 134c, creating a meander structure side-plated antenna 132c.

Persons of ordinary skill in the art will understand that the lengths and widths of first portions 134a-134c, and second portions 136t1-136t2 and 136b1-136b2 can be selected to achieve a desired bandwidth and center frequency for side-plated antenna 132c.

Figure 2D:
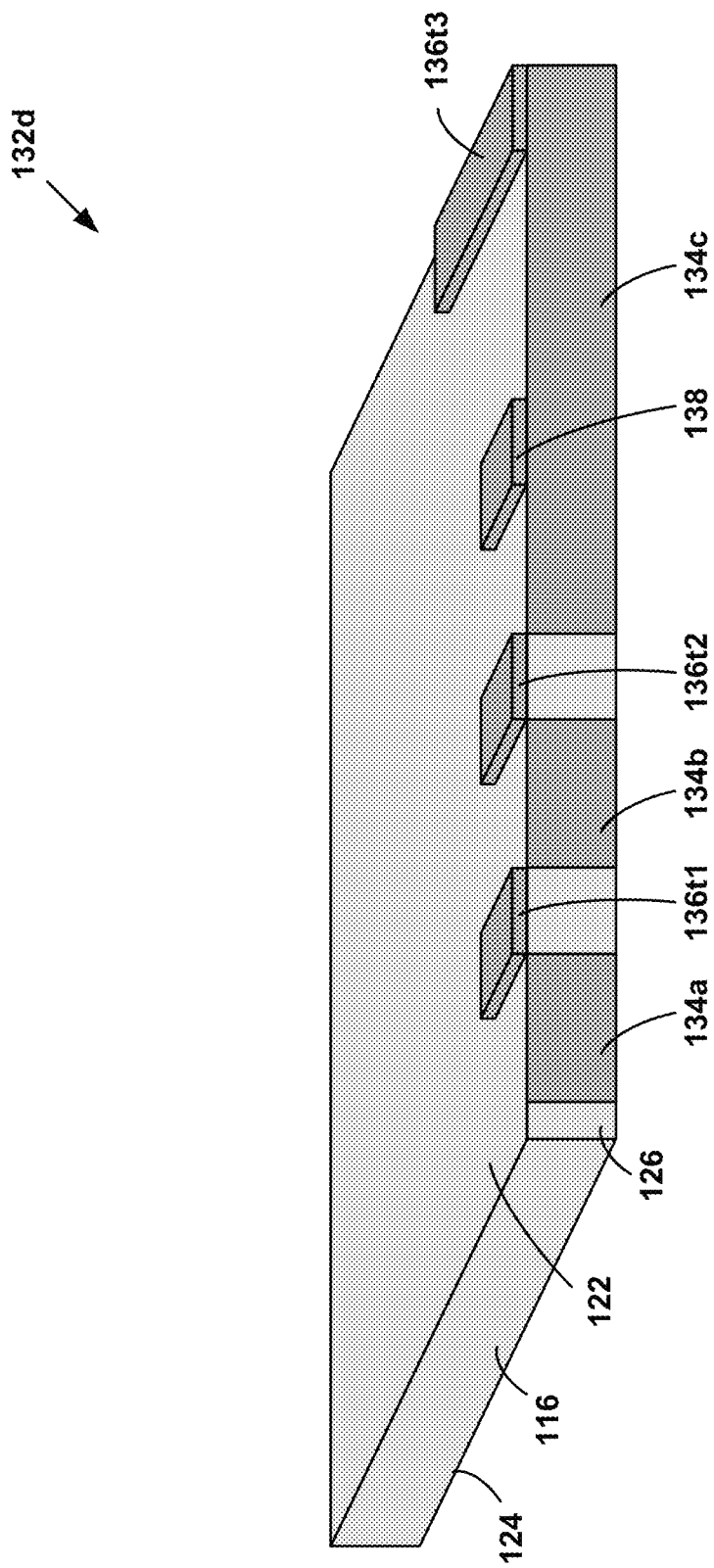

FIG. 2D depicts a fourth example embodiment of a side-plated antenna 132d disposed on printed circuit board 116. Side-plated antenna 132d is similar to side-plated antenna 132a of FIG. 2A, including second portions 136t1-136t2 disposed on top side 122 of printed circuit board 116, but also including second portion 136t3 disposed on top side 122 of printed circuit board 116 at an end of first portion 134c. Second portion 136t3 and RF feed input terminal 138 are electrically connected to first portion 134c, creating an inverted-F meander structure side-plated antenna 132d.

Persons of ordinary skill in the art will understand that the lengths and widths of first portions 134a-134c, and second portions 136*t*1-136*t*3 can be selected to achieve a desired bandwidth and center frequency for side-plated antenna 132*d*.

Figure 2E:
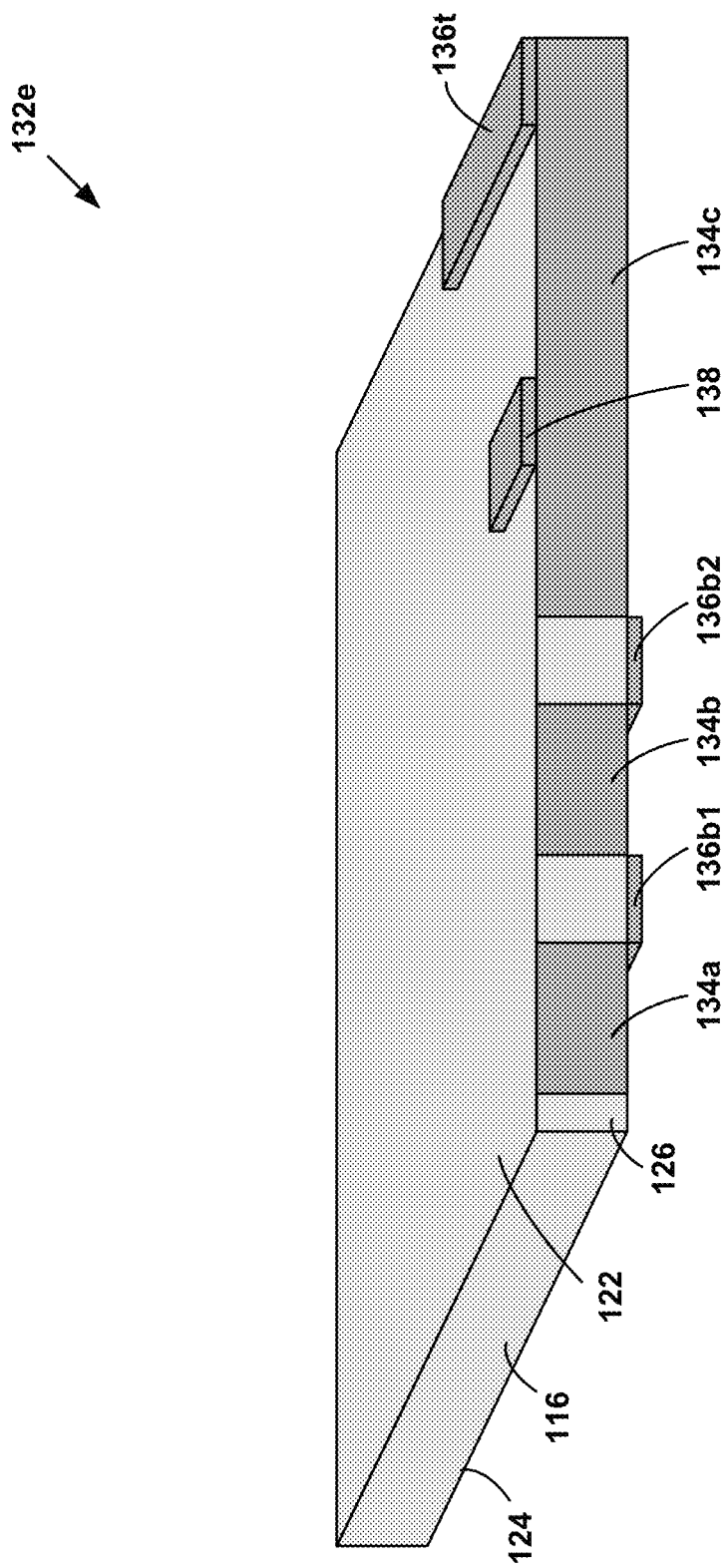

FIG. 2E depicts a fifth example embodiment of a side-plated antenna 132*e* disposed on printed circuit board 116. Side-plated antenna 132*e* is similar to side-plated antenna 132*b* of FIG. 2B, including second portions 136*b*1-136*b*2 disposed on bottom side 124 of printed circuit board 116, but also including second portion 136*t*3 disposed on top side 122 of printed circuit board 116 at an end of first portion 134*c*. Second portion 136*t*3 and RF feed input terminal 138 are electrically connected to first portion 134*c*, creating an inverted-F meander structure side-plated antenna 132*e*.

Persons of ordinary skill in the art will understand that the lengths and widths of first portions 134*a*-134*c*, and second portions 136*b*1-136*b*2 and 136*t*3 can be selected to achieve a desired bandwidth and center frequency for side-plated antenna 132*c*.

Figure 2F:
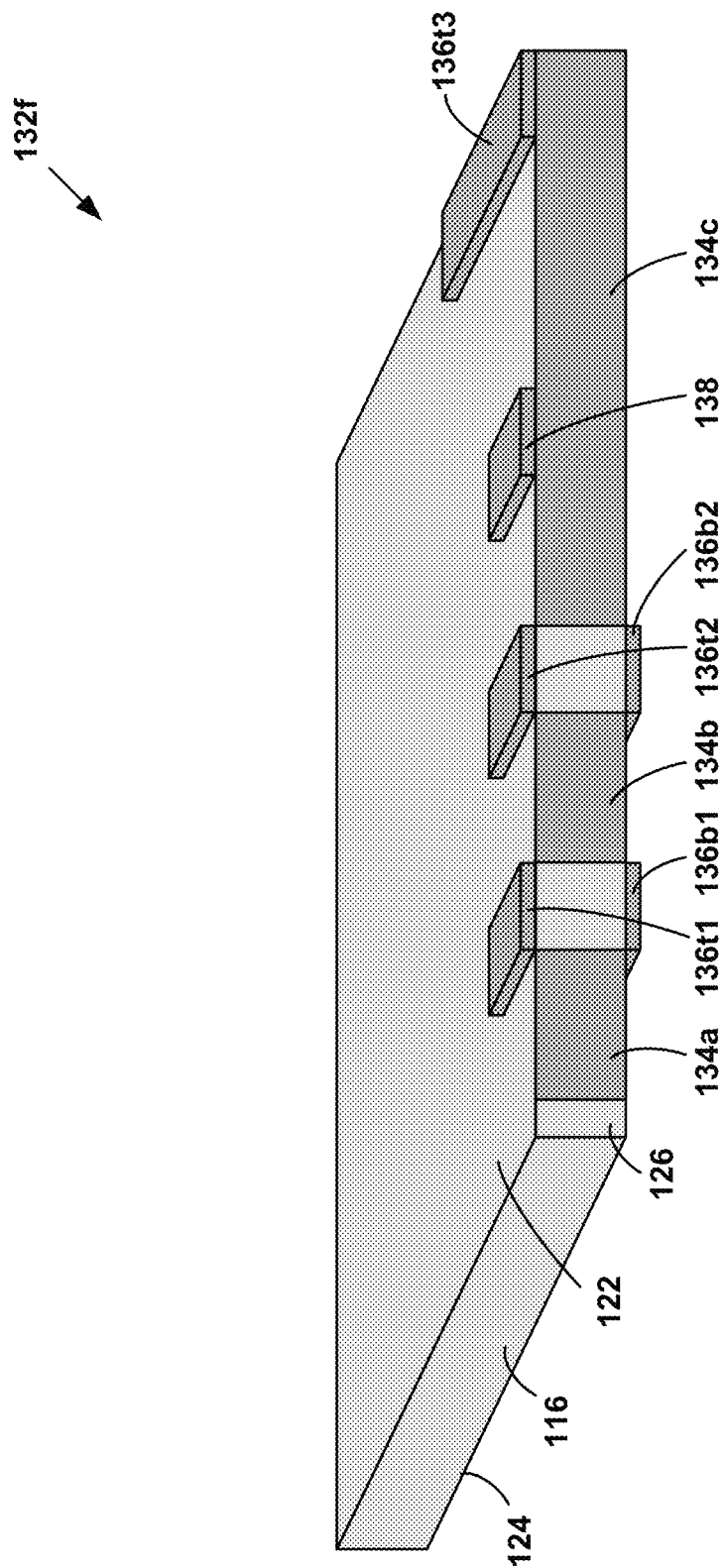

FIG. 2F depicts a sixth example embodiment of a side-plated antenna 132*f* disposed on printed circuit board 116. Side-plated antenna 132*f* has an inverted-F meander structure and combines the elements of side-plated antenna 132*d* of FIG. 2D and side-plated antenna 132*e* of FIG. 2F, with second portions 136*t*1-136*t*2 disposed on top side 122 of printed circuit board 116, second portions 136*b*1-136*b*2 disposed on bottom side 124 of printed circuit board 116, and second portion 136*t*3 disposed on top side 122 of printed circuit board 116 at an end of first portion 134*c*. Second portion 136*t*3 and RF feed input terminal 138 are electrically connected to first portion 134*c*, creating an inverted-F meander structure side-plated antenna 132*f*.

Persons of ordinary skill in the art will understand that the lengths and widths of first portions 134*a*-134*c*, and second portions 136*t*1-136*t*3 and 136*b*1-136*b*2 can be selected to achieve a desired bandwidth and center frequency for side-plated antenna 132*c*.

Figure 2G:
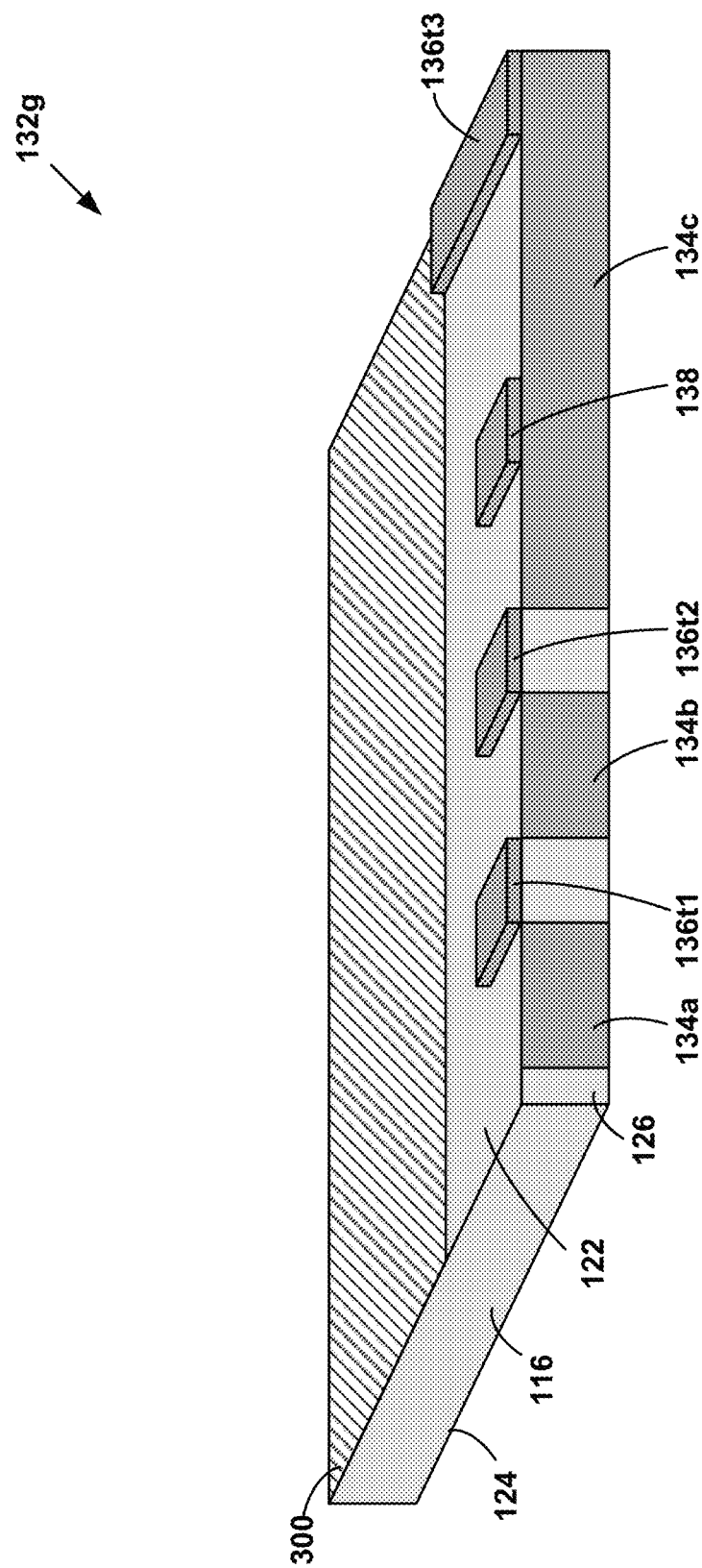

FIG. 2G depicts a seventh example embodiment of a side-plated antenna 132*g* disposed on printed circuit board 116. Side-plated antenna 132*g* is similar to side-plated antenna 132*d* of FIG. 2D, but also includes a first conductive plate 300 disposed on top side 122 of printed circuit board 116. In embodiments, first conductive plate 300 is an electrically conductive material (e.g., copper or other similar conductive material). In an embodiment, first conductive plate 300 is a ground plane electrically connected to second portion 136*t*3 to form a ground connection coupled to inverted-F meander structure side-plated antenna 132*g*.

Figure 2H:
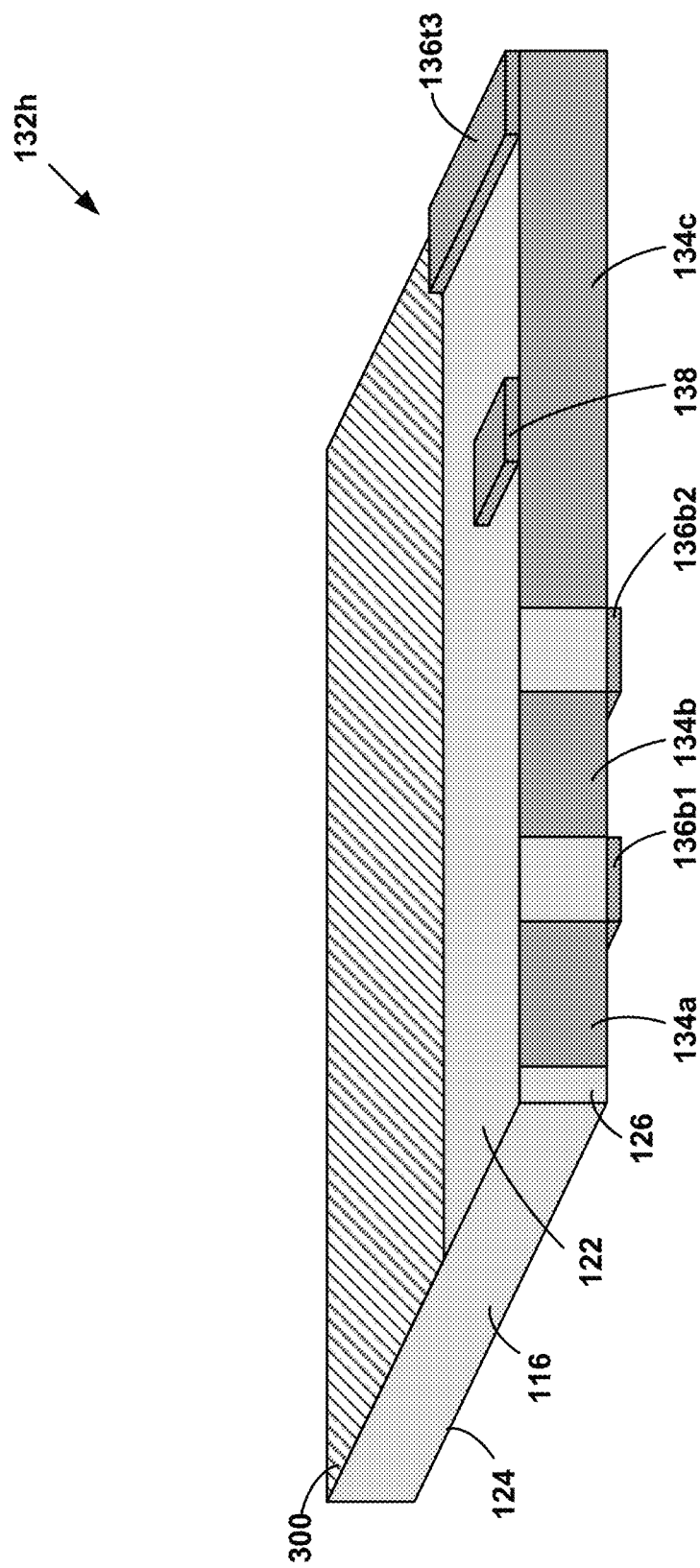

FIG. 2H depicts an eighth example embodiment of a side-plated antenna 132*h* disposed on printed circuit board 116. Side-plated antenna 132*h* is similar to side-plated antenna 132*e* of FIG. 2E, but also includes first conductive plate 300 disposed on top side 122 of printed circuit board 116. In an embodiment, first conductive plate 300 is a ground plane electrically connected to second portion 136*t*3 to form a ground connection coupled to inverted-F meander structure side-plated antenna 132*h*.

Figure 2I:
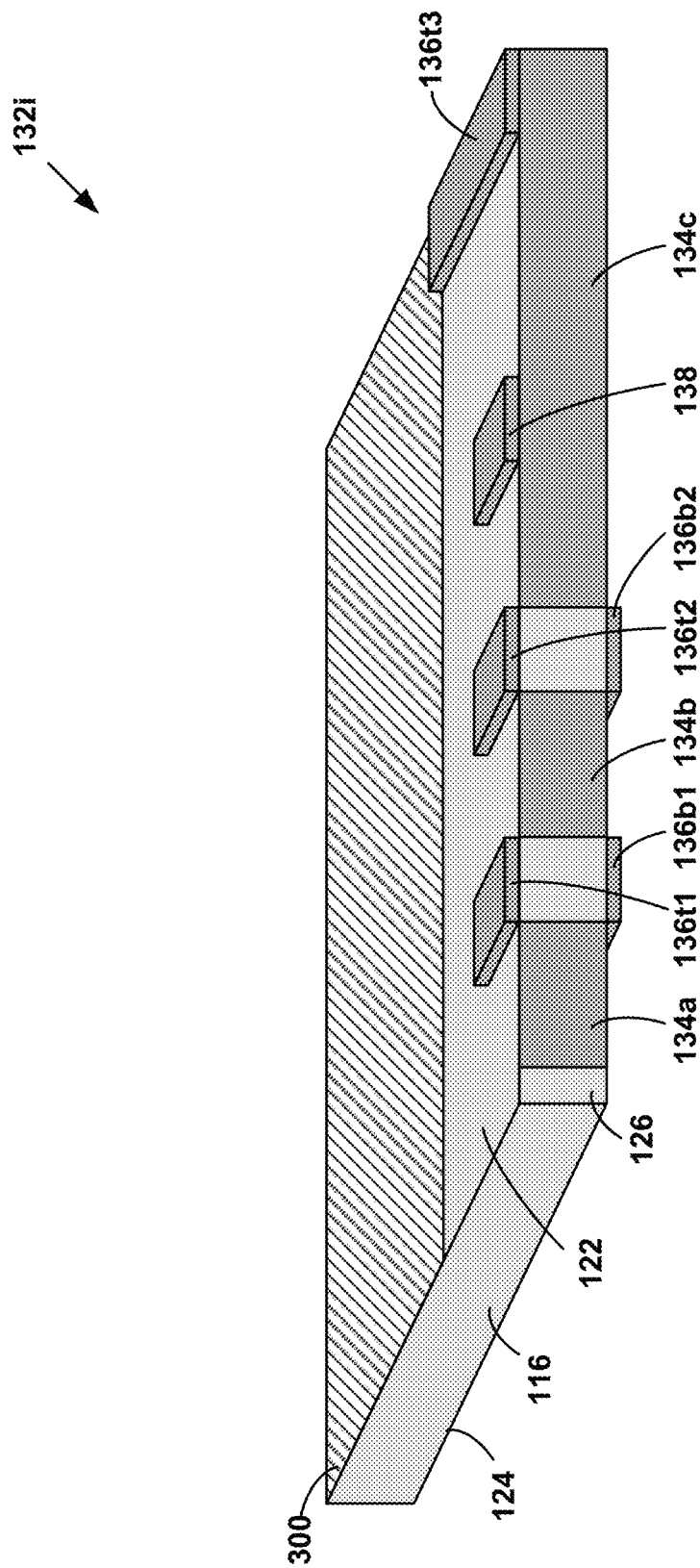

FIG. 2I depicts a ninth example embodiment of a side-plated antenna 132*i* disposed on printed circuit board 116. Side-plated antenna 132*i* is similar to side-plated antenna 132*f* of FIG. 2F, but also includes first conductive plate 300 disposed on top side 122 of printed circuit board 116. In an embodiment, first conductive plate 300 is a ground plane electrically connected to second portion 136*t*3 to form a ground connection coupled to inverted-F meander structure side-plated antenna 132*i*.

Figure 2J:
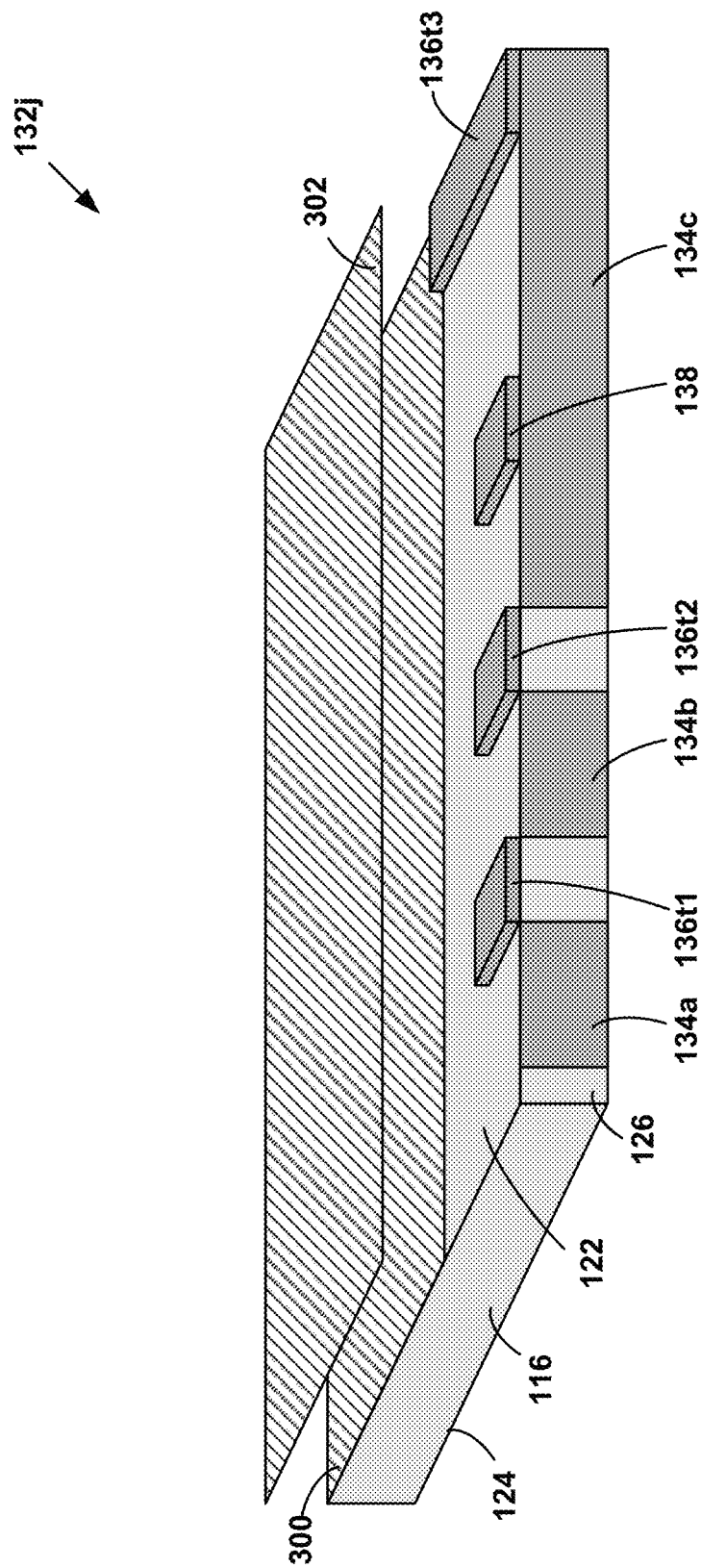

FIG. 2J depicts a tenth example embodiment of a side-plated antenna 132*j* disposed on printed circuit board 116.

Side-plated antenna 132*j* is similar to side-plated antenna 132*g* of FIG. 2G, but also includes a second conductive plate 302 disposed above first conductive plate 300. In embodiments, second conductive plate 302 is an electrically and/or thermally conductive material (e.g., copper or other similar conductive material). In embodiments, second conductive plate 302 may be used as a heat sink and/or a dedicated ground plane for side-plated antenna 132*j*. In an embodiment, second conductive plate 302 is a dedicated ground plane electrically connected to second portion 136*t*3 to form a dedicated ground connection coupled to inverted-F meander structure side-plated antenna 132*j*.

Figure 2K:
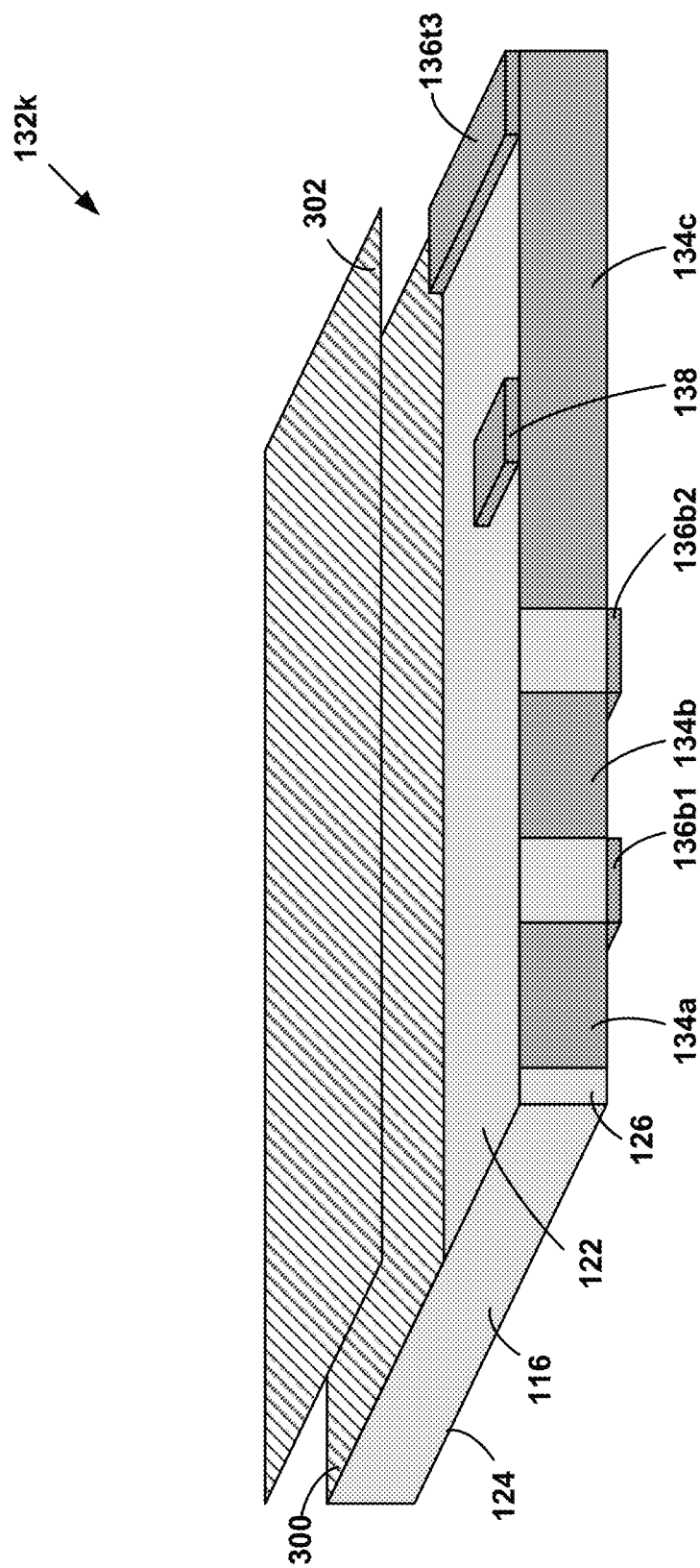

FIG. 2K depicts a eleventh example embodiment of a side-plated antenna 132*k* disposed on printed circuit board 116. Side-plated antenna 132*k* is similar to side-plated antenna 132*h* of FIG. 2H, but also includes second conductive plate 302 disposed above first conductive plate 300. In embodiments, second conductive plate 302 may be used as a heat sink and/or a dedicated ground plane for side-plated antenna 132*k*. In an embodiment, second conductive plate 302 is a dedicated ground plane electrically connected to second portion 136*t*3 to form a dedicated ground connection coupled to inverted-F meander structure side-plated antenna 132*k*.

Figure 2L:
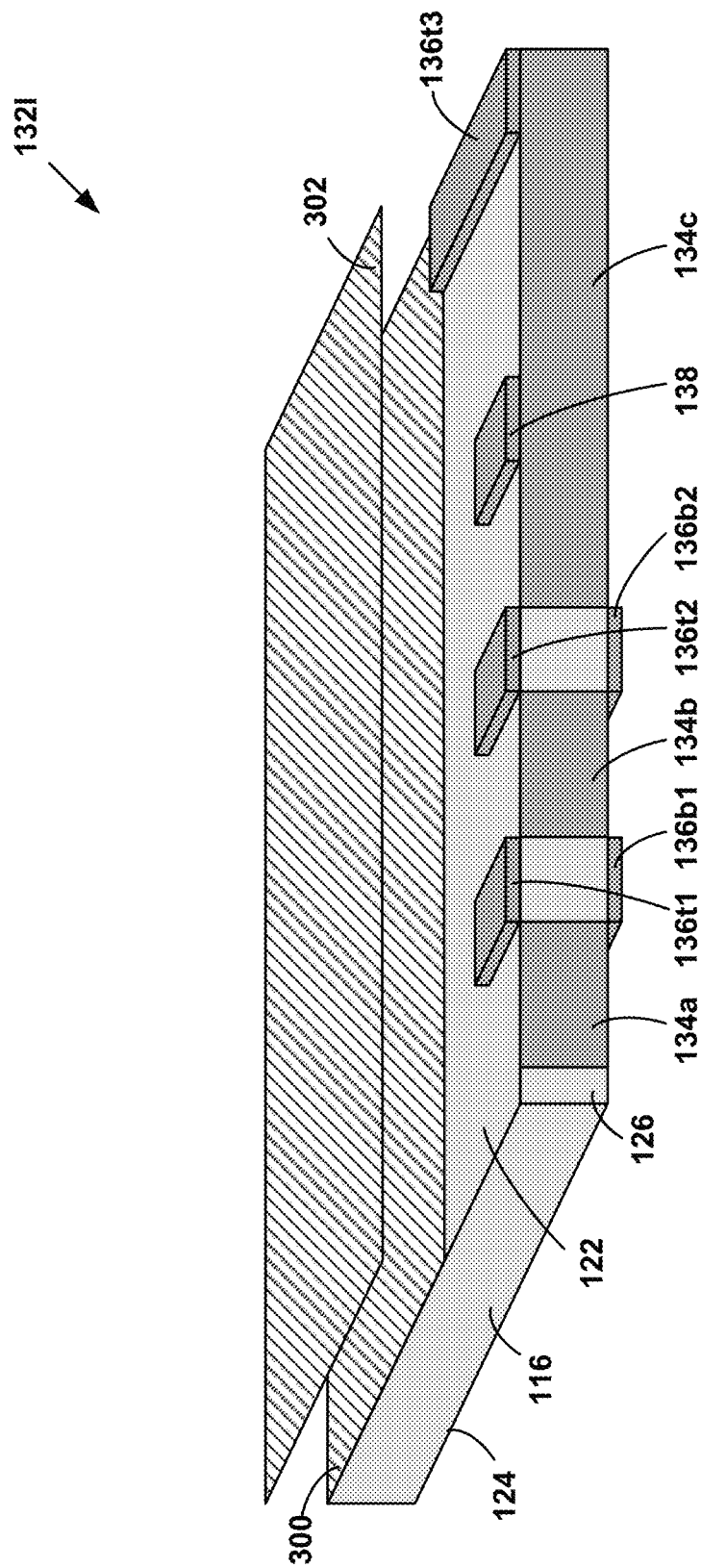

FIG. 2L depicts an twelfth example embodiment of a side-plated antenna 132*l* disposed on printed circuit board 116. Side-plated antenna 132*l* is similar to side-plated antenna 132*i* of FIG. 2I, but also includes second conductive plate 302 disposed above first conductive plate 300. In embodiments, second conductive plate 302 may be used as a heat sink and/or a dedicated ground plane for side-plated antenna 132*l*. In an embodiment, second conductive plate 302 is a dedicated ground plane electrically connected to second portion 136*t*3 to form a dedicated ground connection coupled to inverted-F meander structure side-plated antenna 132*l*.

Figure 2M:
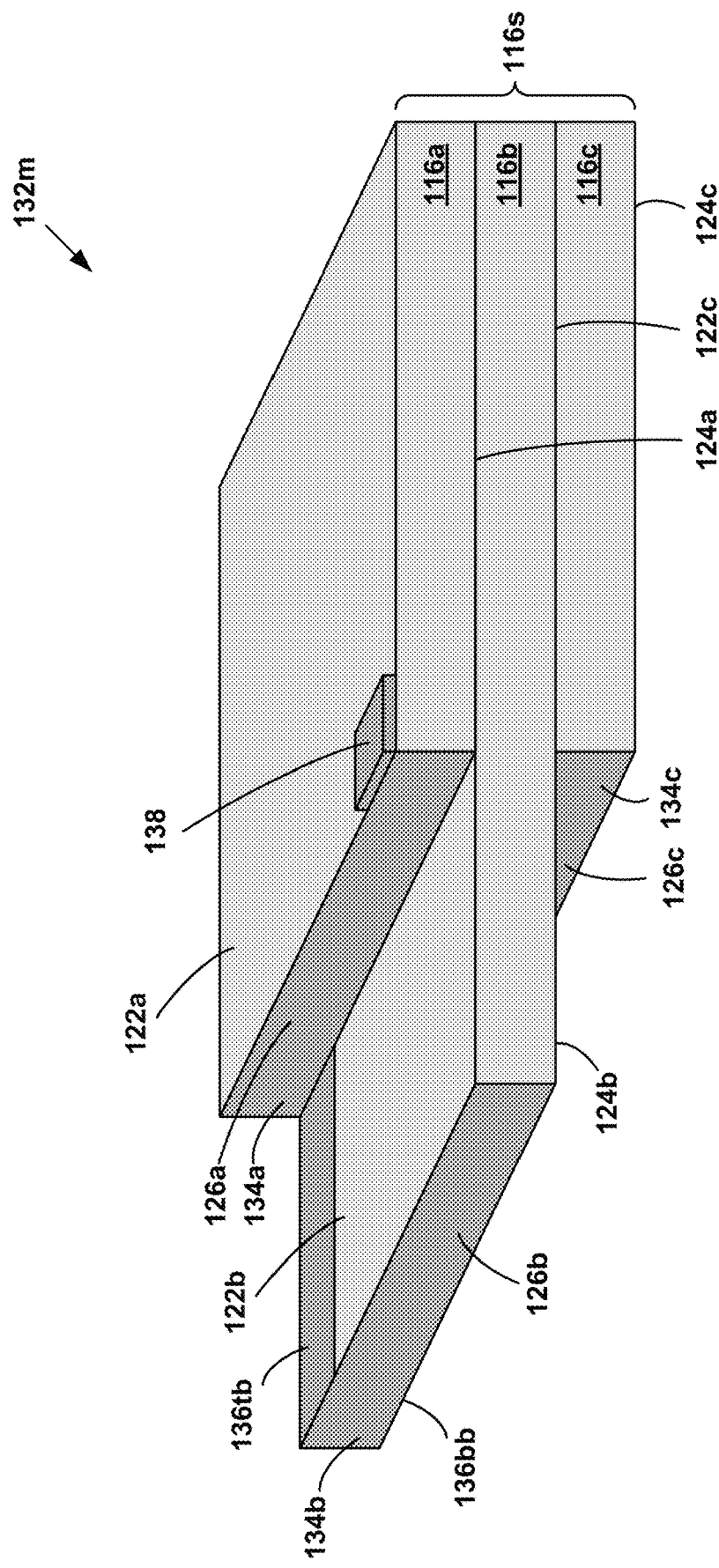

FIG. 2M depicts a thirteenth example embodiment of a side-plated antenna 132*m* disposed on a step printed circuit board 116*s*. In an embodiment, step printed circuit board 116*s* includes a first printed circuit board layer 116*a*, a second printed circuit board layer 116*b*, and a third printed circuit board layer 116*c*. In an embodiment, first printed circuit board layer 116*a* is disposed on second printed circuit board layer 116*b*, which in turn is disposed on third printed circuit board layer 116*c*. Persons of ordinary skill in the art will understand that step printed circuit board 116*s* may include more or fewer than three printed circuit board layers. Persons of ordinary skill in the art will understand that step printed circuit board 116*s* is typically referred to as a 4-layer PCB (conductive copper layers at top, inner layer 1, inner layer 2, and bottom).

In an embodiment, first printed circuit board layer 116*a* includes a top side 122*a*, a bottom side 124*a*, and a peripheral edge 126*a* disposed between top side 122*a* and bottom side 124*a*, second printed circuit board layer 116*b* includes a top side 122*b*, a bottom side 124*b*, and a peripheral edge 126*b* disposed between top side 122*b* and bottom side 124*b*, and third printed circuit board layer 116*c* includes a top side 122*c*, a bottom side 124*c*, and a peripheral edge 126*c* disposed between top side 122*c* and bottom side 124*c*.

In an embodiment, second printed circuit board layer 116*b* extends beyond first printed circuit board layer 116*a* and third printed circuit board layer 116*c* so that portions of peripheral edges 126*a*-126*c* are distinct from one another and allow for different side-plated antenna structures.

In an embodiment, side-plated antenna 132*m* includes a first portion 134*a* disposed on peripheral edge 126*a* of first printed circuit board layer 116a, a first portion 134b disposed on peripheral edge 126b of second printed circuit board layer 116b, and a third portion 134c disposed on peripheral edge 126c of third printed circuit board layer 116c. In an embodiment, side-plated antenna 132m includes a second portion 136tb disposed on top side 122b of second printed circuit board layer 116b, a second portion 136bb disposed on bottom side 124b of second printed circuit board layer 116b, and an RF feed input terminal 138 disposed on top side 122a of first printed circuit board layer 116a.

In an embodiment, first portions 134a-134c are fabricated by electroplating a metallic material (e.g., copper, nickel, or other similar conductive material) on peripheral edges 126a-126c, respectively. In an embodiment, second portions 136tb-136bb are fabricated by forming conductive traces on top side 122b and bottom side 124b, respectively, of second printed circuit board layer 116b. In an embodiment, RF feed input terminal 138 is fabricated by forming a conductive trace on top side 122a of first printed circuit board layer 116a. Persons of ordinary skill in the art will understand that other techniques may be used to fabricate first portions 134a-134c, second portions 136tb-136bb, and RF feed input terminal 138.

In the example depicted in FIG. 2M, second portion 136tb is disposed on top side 122b of second printed circuit board layer 116b between first portions 134a and 134b, and second portion 136bb is disposed on bottom side 124b of second printed circuit board layer 116b between first portions 134b and 134c. Second portion 136tb is electrically connected to first portions 134a and 134b, second portion 136bb is electrically connected to first portions 134b and 134c, and RF feed input terminal 138 is electrically connected to first portions 134a, 134b and 134c, creating a monopole side-plated antenna 132m.

Persons of ordinary skill in the art will understand that the lengths and widths of first portions 134a-134c, and second portions 136tb-136bb can be selected to achieve a desired bandwidth and center frequency for monopole side-plated antenna 132m.

Figure 2N:
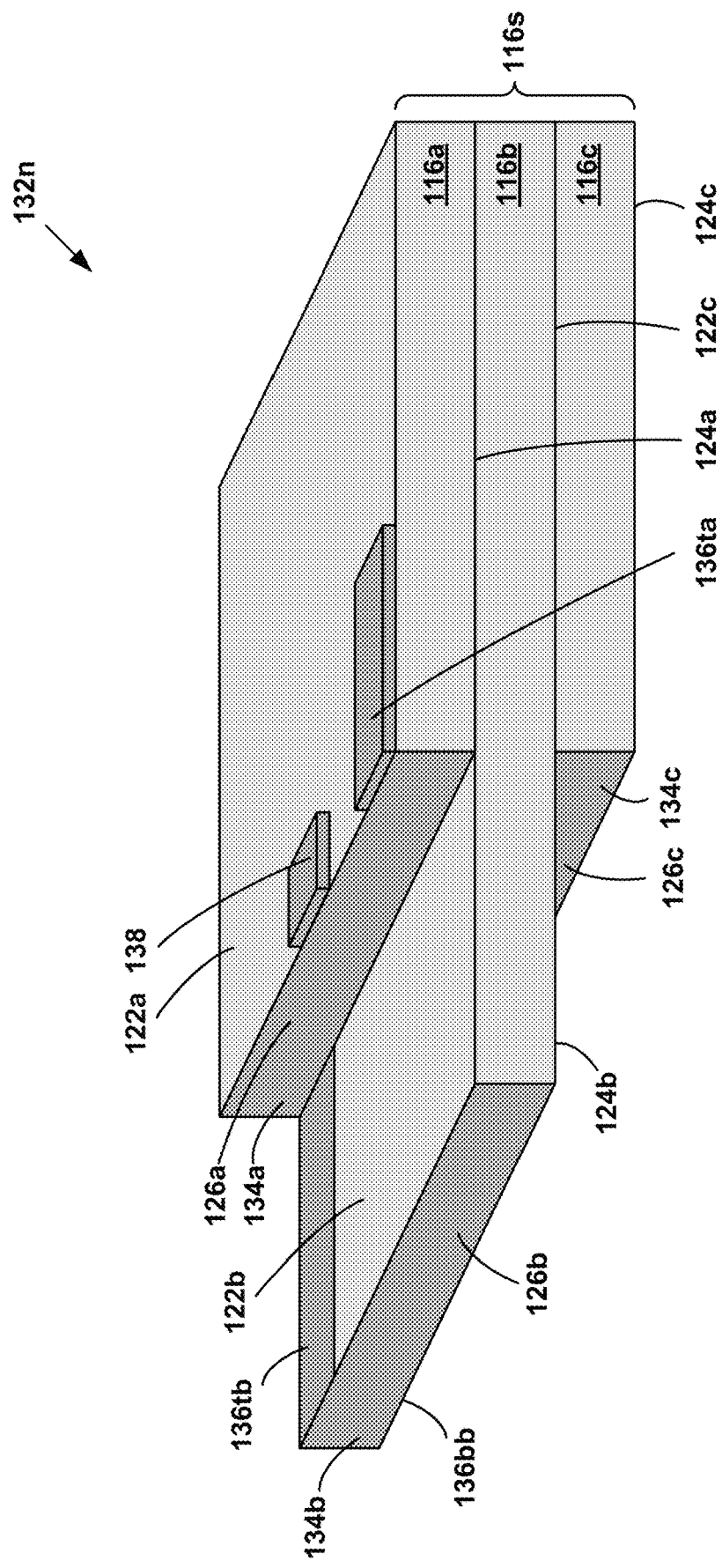

FIG. 2N depicts a fourteenth example embodiment of a side-plated antenna 132n disposed on step printed circuit board 116s. Side-plated antenna 132n is similar to side-plated antenna 132m of FIG. 2M, but also including second portion 136ta disposed on top side 122a of first printed circuit board layer 116a at an end of first portion 134a. Second portion 136ta and RF feed input terminal 138 are electrically connected to first portion 134a, creating an inverted-F monopole side-plated antenna 132n.

Persons of ordinary skill in the art will understand that the lengths and widths of first portions 134a-134c, and second portions 136ta-136tb and 136bb can be selected to achieve a desired bandwidth and center frequency for monopole side-plated antenna 132n.

Figure 2O:
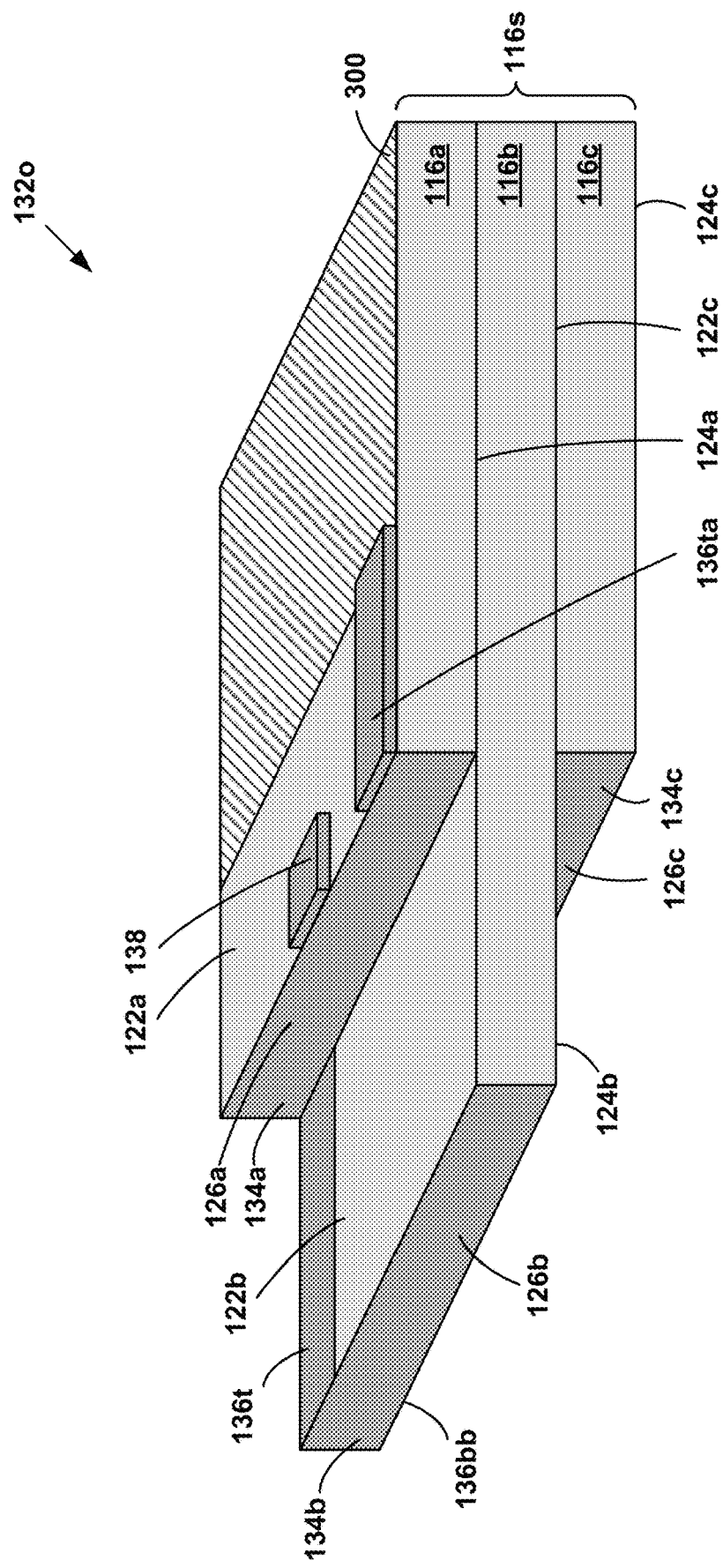

FIG. 2O depicts a fifteenth example embodiment of a side-plated antenna 132o disposed on step printed circuit board 116s. Side-plated antenna 132o is similar to side-plated antenna 132n of FIG. 2N, but also includes first conductive plate 300 disposed on top side 122a of first printed circuit board layer 116a. In embodiments, first conductive plate 300 is an electrically conductive material (e.g., copper or other similar conductive material). In an embodiment, first conductive plate 300 is a ground plane electrically connected to second portion 136ta to form a ground connection coupled to inverted-F monopole side-plated antenna 132o.

Figure 2P:
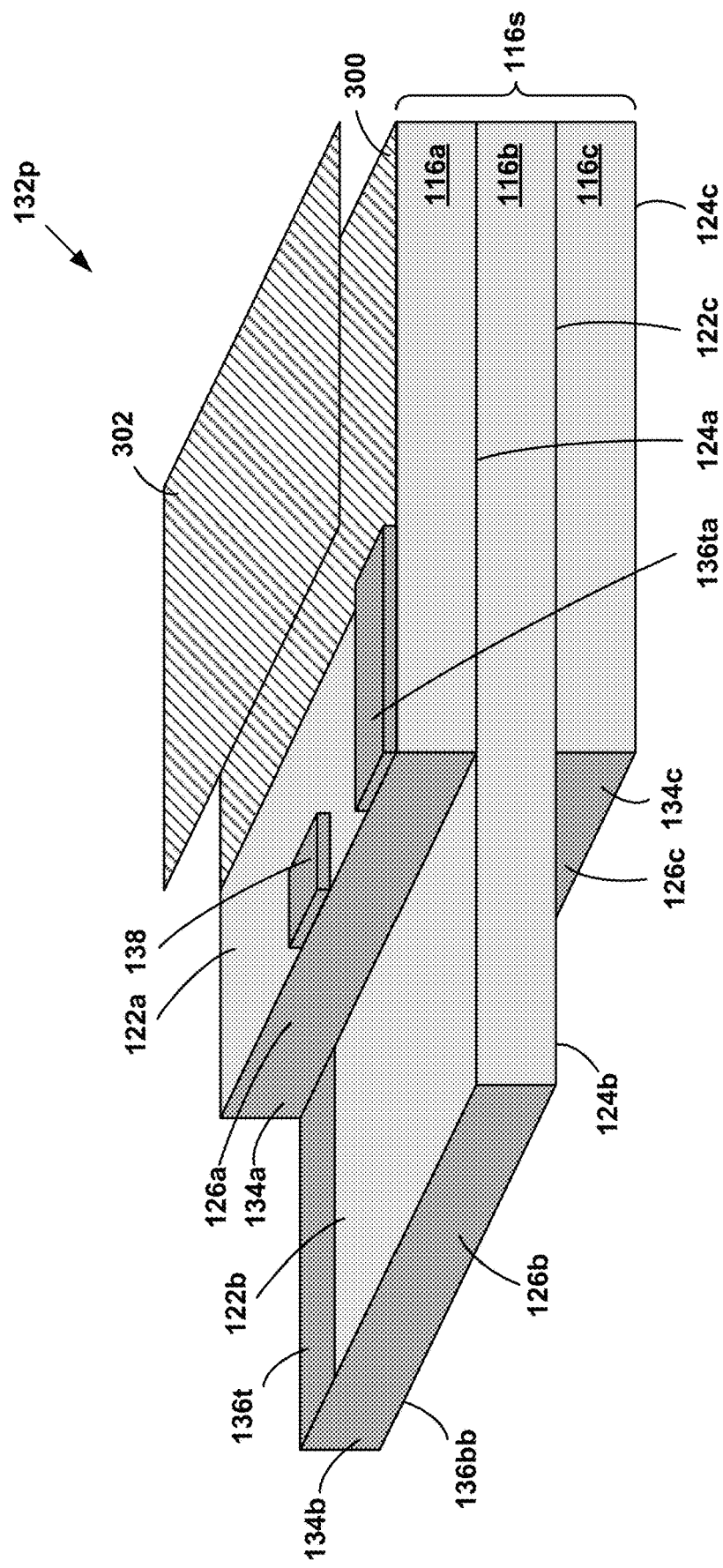

FIG. 2P depicts a sixteenth example embodiment of a side-plated antenna 132p disposed on step printed circuit board 116s. Side-plated antenna 132p is similar to side-plated antenna 132o of FIG. 2O, but also includes second conductive plate 302 disposed above first conductive plate 300. In embodiments, second conductive plate 302 is an electrically and/or thermally conductive material (e.g., copper or other similar conductive material). In embodiments, second conductive plate 302 may be used as a heat sink and/or a dedicated ground plane for side-plated antenna 132p. In an embodiment, second conductive plate 302 is a dedicated ground plane electrically connected to second portion 136ta to form a dedicated ground connection coupled to inverted-F monopole side-plated antenna 132p.

Figure 2Q:
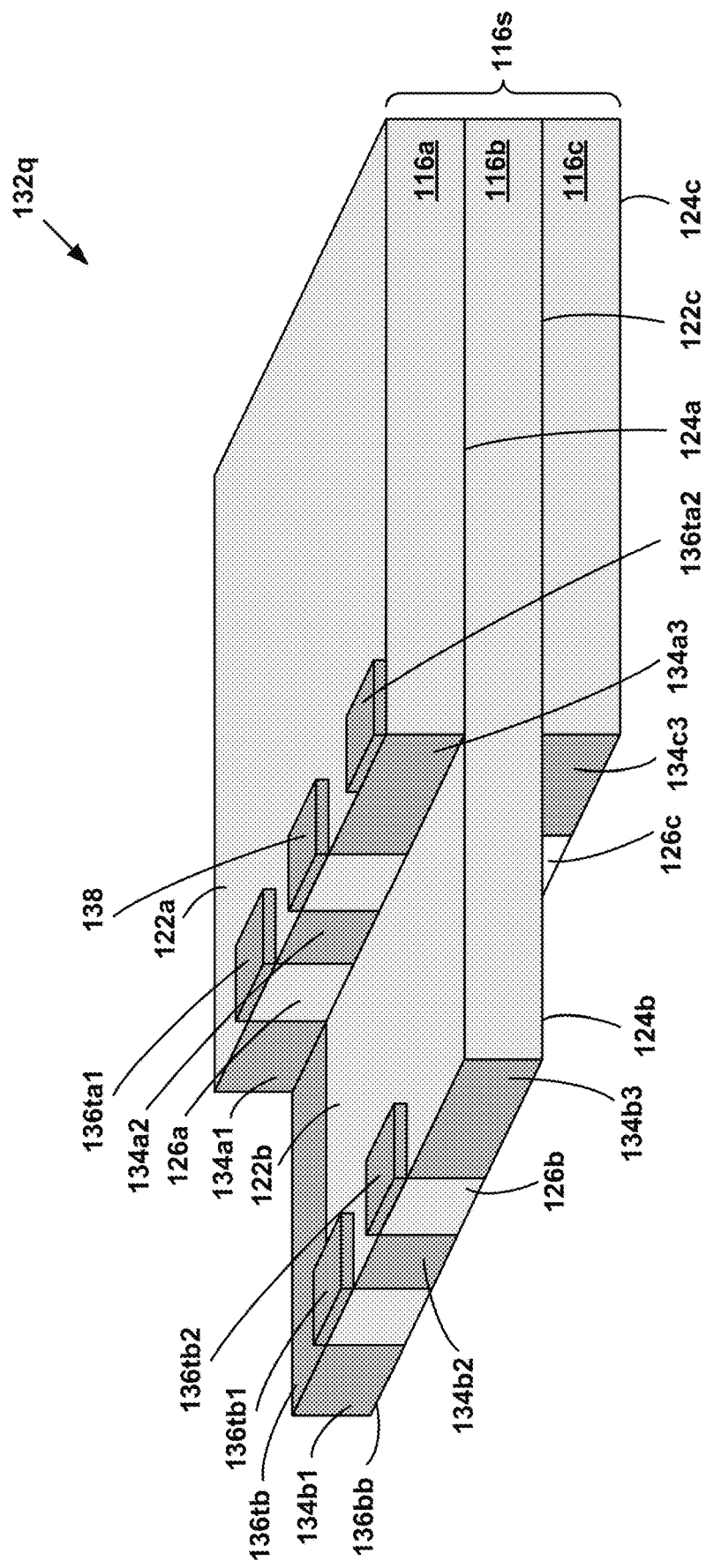

FIG. 2Q depicts a seventeenth example embodiment of a side-plated antenna 132q disposed on step printed circuit board 116s. Side-plated antenna 132q includes first portions 134a1-134a3 disposed on peripheral edge 126a of first printed circuit board layer 116a, first portions 134b1-134b3 disposed on peripheral edge 126b of second printed circuit board layer 116b, first portions 134c1-134c3 disposed on peripheral edge 126c of third printed circuit board layer 116c, second portions 136ta1-136ta2 disposed on top side 122a of first printed circuit board layer 116a, second portions 136tb and 136tb1-136tb2 disposed on top side 122b of second printed circuit board layer 116b, second portion 136bb disposed on bottom side 124b of second printed circuit board layer 116b, and RF feed input terminal 138 disposed on top side 122a of first printed circuit board layer 116a.

Persons of ordinary skill in the art will understand that side-plated antenna 132q may include more or fewer than three first portions 134a1-134a3 on first printed circuit board layer 116a, more or fewer than three first portions 134b1-134b3 on second printed circuit board layer 116b, and more or fewer than three first portions 134c1-134c3 on third printed circuit board layer 116c. Persons of ordinary skill in the art will understand that side-plated antenna 132q may include more or fewer than two second portions 136ta1-136ta2 on first printed circuit board layer 116a, and more or fewer than three second portions 136tb and 136tb1-136tb2 on second printed circuit board layer 116b.

In an embodiment, first portions 134a1-134a3, 134b1-134b3 and 134c1-134c3 are fabricated by electroplating a metallic material (e.g., copper, nickel, or other similar conductive material) on peripheral edges 126a-126c, respectively, of step printed circuit board 116s. In an embodiment, second portions 136ta1-136ta2 and RF feed input terminal 138 are fabricated by forming conductive traces on top side 122a of first printed circuit board layer 116a, and second portions 136tb and 136tb1-136tb2 are fabricated by forming conductive traces on top side 122b of second printed circuit board layer 116b. Persons of ordinary skill in the art will understand that other techniques may be used to fabricate first portions 134a1-134a3, 134b1-134b3 and 134c1-134c3, second portions 136ta1-136ta2, 136tb and 136tb1-136tb2, and RF feed input terminal 138.

In the example depicted in FIG. 2Q, second portion 136ta1 is disposed on top side 122a of first printed circuit board layer 116a between first portions 134a1 and 134a2, second portion 136ta2 is disposed on top side 122a of first printed circuit board layer 116a at an end of first portion 134a3, second portion 136tb1 is disposed on top side 122b of second printed circuit board layer 116b between first portions 134b1 and 134b2, second portion 136tb2 is disposed on top side 122b of second printed circuit board layer 116b between first portions 134b2 and 134b3, second portion 136*tb* is disposed on top side 122*b* of second printed circuit board layer 116*b* between first portions 134*a*1 and 134*b*1, and second portion 136*bb* is disposed on bottom side 124*b* of second printed circuit board layer 116*b* between first portions 134*b*1 and 134*c*1.

Second portion 136*ta*1 is electrically connected to first portions 134*a*1 and 134*a*2, second portion 136*ta*2 is electrically connected to first portion 134*a*3, second portion 136*tb*1 is electrically connected to first portions 134*b*1 and 134*b*2, second portion 136*tb*2 is electrically connected to first portions 134*b*2 and 134*b*3, second portion 136*tb* is electrically connected to first portions 134*a*1 and 134*b*1, second portion 136*bb* is electrically connected to first portions 134*b*1 and 134*c*1, and RF feed input terminal 138 is electrically connected to first portions 134*a*2 and 134*a*3, creating a meander structure side-plated antenna 132*q*.

Persons of ordinary skill in the art will understand that the lengths and widths of first portions 134*a*1-134*a*3, 134*b*1-134*b*3 and 134*c*1-134*c*3, and second portions 136*ta*1-136*ta*2, 136*tb*, 136*tb*1-136*tb*2 and 136*bb* can be selected to achieve a desired bandwidth and center frequency for meander structure side-plated antenna 132*q*.

Figure 2R:
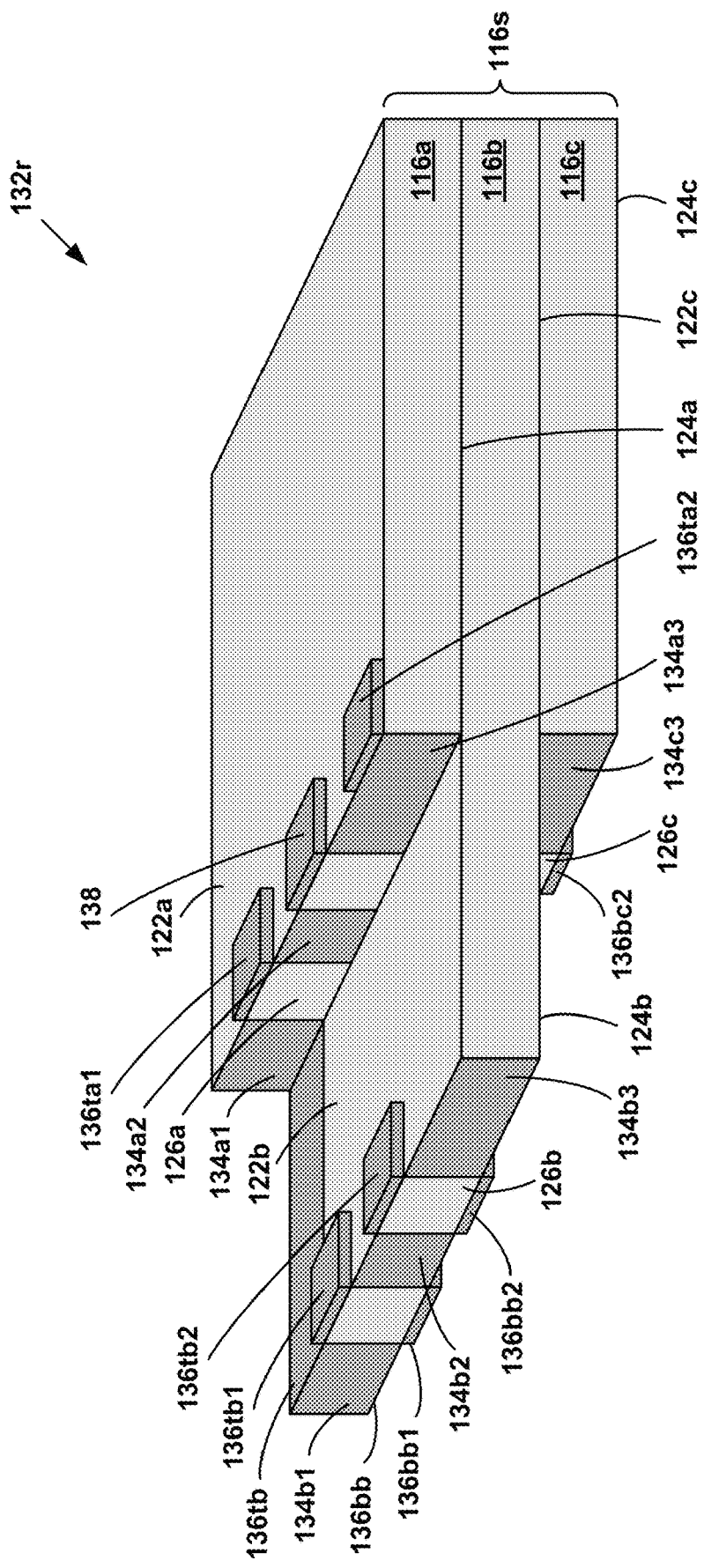

FIG. 2R depicts a eighteenth example embodiment of a side-plated antenna 132*r* disposed on step printed circuit board 116*s*. Side-plated antenna 132*r* is similar to side-plated antenna 132*q* of FIG. 2Q, but also includes second portions 136*bb*1-136*bb*2 disposed on bottom side 124*b* of second printed circuit board layer 116*b*, and second portions 136*bc*1-136*bc*2 disposed on bottom side 124*c* of third printed circuit board layer 116*c*.

Second portion 136*bb*1 is disposed on bottom side 124*b* of second printed circuit board layer 116*b* between first portions 134*b*1 and 134*b*2, second portion 136*bb*2 is disposed on bottom side 124*b* of second printed circuit board layer 116*b* between first portions 134*b*2 and 134*b*3, second portion 136*bc*1 is disposed on bottom side 124*c* of third printed circuit board layer 116*c* between first portions 134*c*1 and 134*c*2, and second portion 136*bc*2 is disposed on bottom side 124*c* of third printed circuit board layer 116*c* between first portions 134*c*2 and 134*c*3.

Second portion 136*bb*1 is electrically connected to first portions 134*b*1 and 134*b*2, second portion 136*bb*2 is electrically connected to first portions 134*b*2 and 134*b*3, second portion 136*bc*1 is electrically connected to first portions 134*c*1 and 134*c*2, and second portion 136*bc*2 is electrically connected to first portions 134*c*2 and 134*c*3.

Persons of ordinary skill in the art will understand that the lengths and widths of first portions 134*a*1-134*a*3, 134*b*1-134*b*3 and 134*c*1-134*c*3, and second portions 136*ta*1-136*ta*2, 136*tb*, 136*tb*1-136*tb*2, 136*bb*, 136*bb*1-136*bb*2 and 136*bc*1-136*bc*2 can be selected to achieve a desired bandwidth and center frequency for meander structure side-plated antenna 132*r*.

Figure 2S:
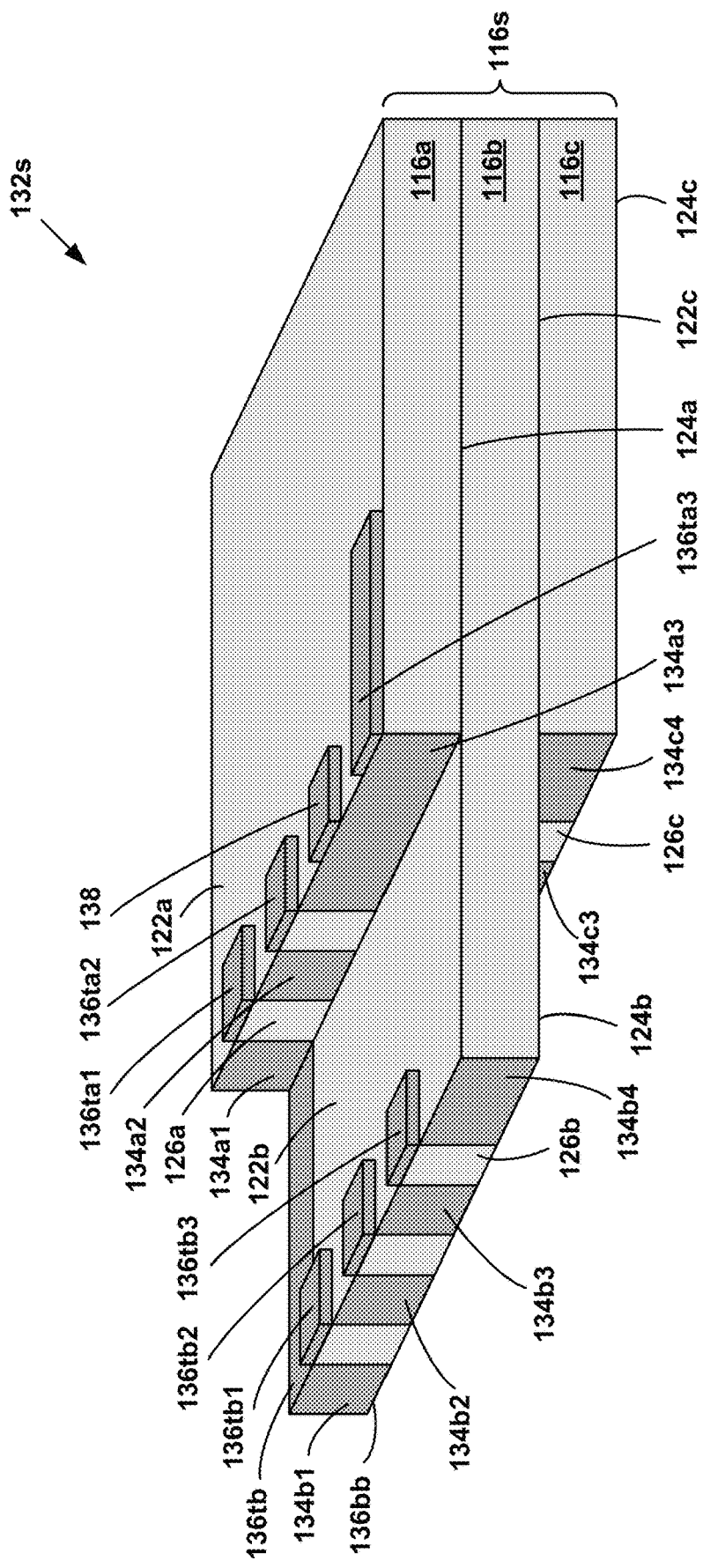

FIG. 2S depicts a nineteenth example embodiment of a side-plated antenna 132*s* disposed on step printed circuit board 116*s*. Side-plated antenna 132*s* is similar to side-plated antenna 132*q* of FIG. 2Q, including second portions 136*ta*1-136*ta*2 disposed on top side 122*a* of first printed circuit board layer 116*a*, but also including second portion 136*ta*3 disposed on top side 122*a* of first printed circuit board layer 116 at an end of first portion 134*a*3. Second portion 136*ta*3 and RF feed input terminal 138 are electrically connected to first portion 134*a*3, creating an inverted-F meander structure side-plated antenna 132*s*.

Persons of ordinary skill in the art will understand that the lengths and widths of first portions 134*a*1-134*a*3, 134*b*1-134*b*3 and 134*c*1-134*c*3, and second portions 136*ta*1-136*ta*3, 136*tb*, 136*tb*1-136*tb*3 and 136*bb* can be selected to achieve a desired bandwidth and center frequency for inverted-F meander structure side-plated antenna 132*s*.

Figure 2T:
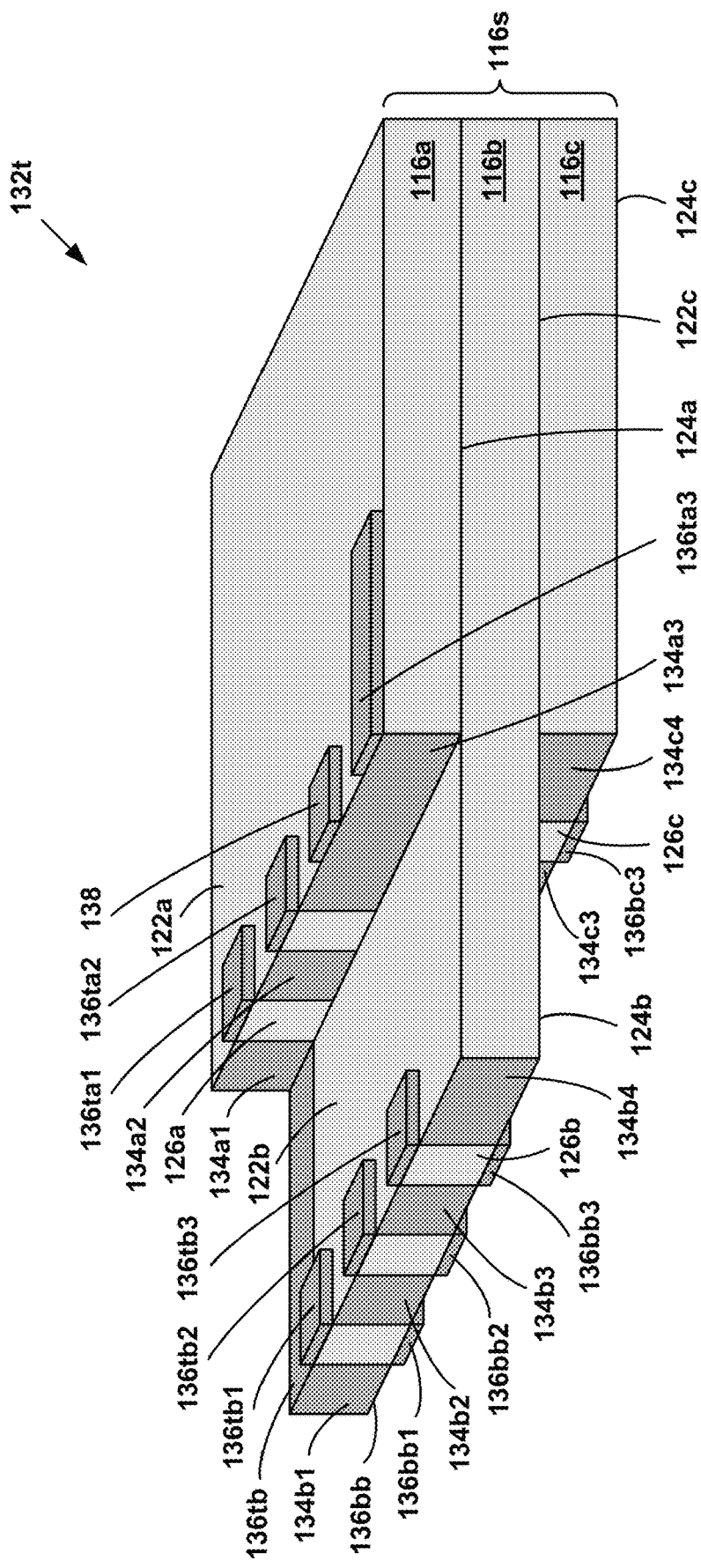

FIG. 2T depicts an twentieth example embodiment of a side-plated antenna 132*t* disposed on step printed circuit board 116*s*. Side-plated antenna 132*t* is similar to side-plated antenna 132*s* of FIG. 2S, but also includes second portions 136*bb*1-136*bb*3 disposed on bottom side 124*b* of second printed circuit board layer 116*b*, and second portions 136*bc*1-136*bc*3 disposed on bottom side 124*c* of third printed circuit board layer 116*c*.

Persons of ordinary skill in the art will understand that the lengths and widths of first portions 134*a*1-134*a*3, 134*b*1-134*b*3 and 134*c*1-134*c*3, and second portions 136*ta*1-136*ta*3, 136*tb*, 136*tb*1-136*tb*3, 136*bb*, and 136*bc*1-136*bc*3 can be selected to achieve a desired bandwidth and center frequency for inverted-F meander structure side-plated antenna 132*t*.

Figure 2U:
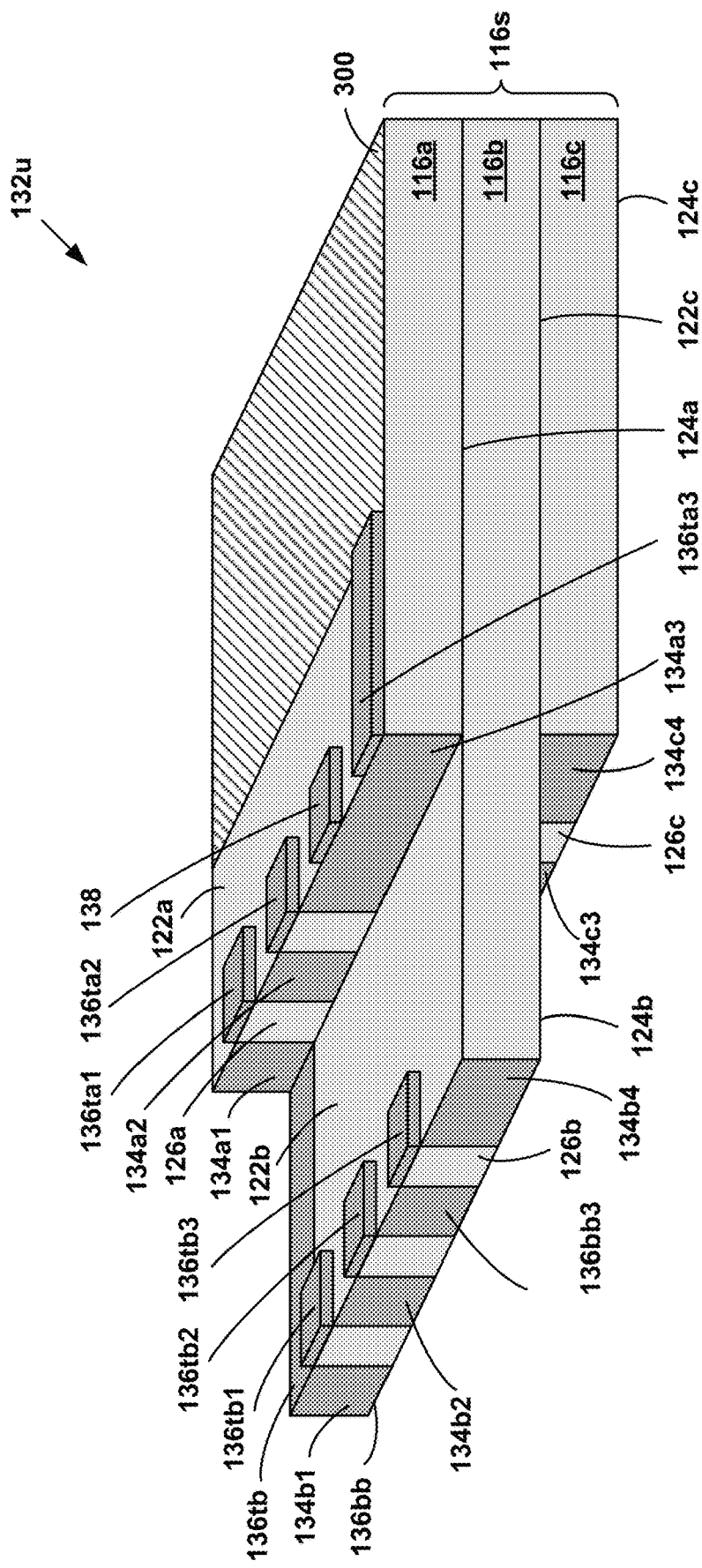

FIG. 2U depicts a twenty-first example embodiment of a side-plated antenna 132*u* disposed on step printed circuit board 116*s*. Side-plated antenna 132*u* is similar to side-plated antenna 132*s* of FIG. 2S, but also includes first conductive plate 300 disposed on top side 122*a* of first printed circuit board layer 116*a*. In embodiments, first conductive plate 300 is an electrically conductive material (e.g., copper or other similar conductive material). In an embodiment, first conductive plate 300 is a ground plane electrically connected to second portion 136*ta*3 to form a ground connection coupled to inverted-F meander structure side-plated antenna 132*u*.

Figure 2V:
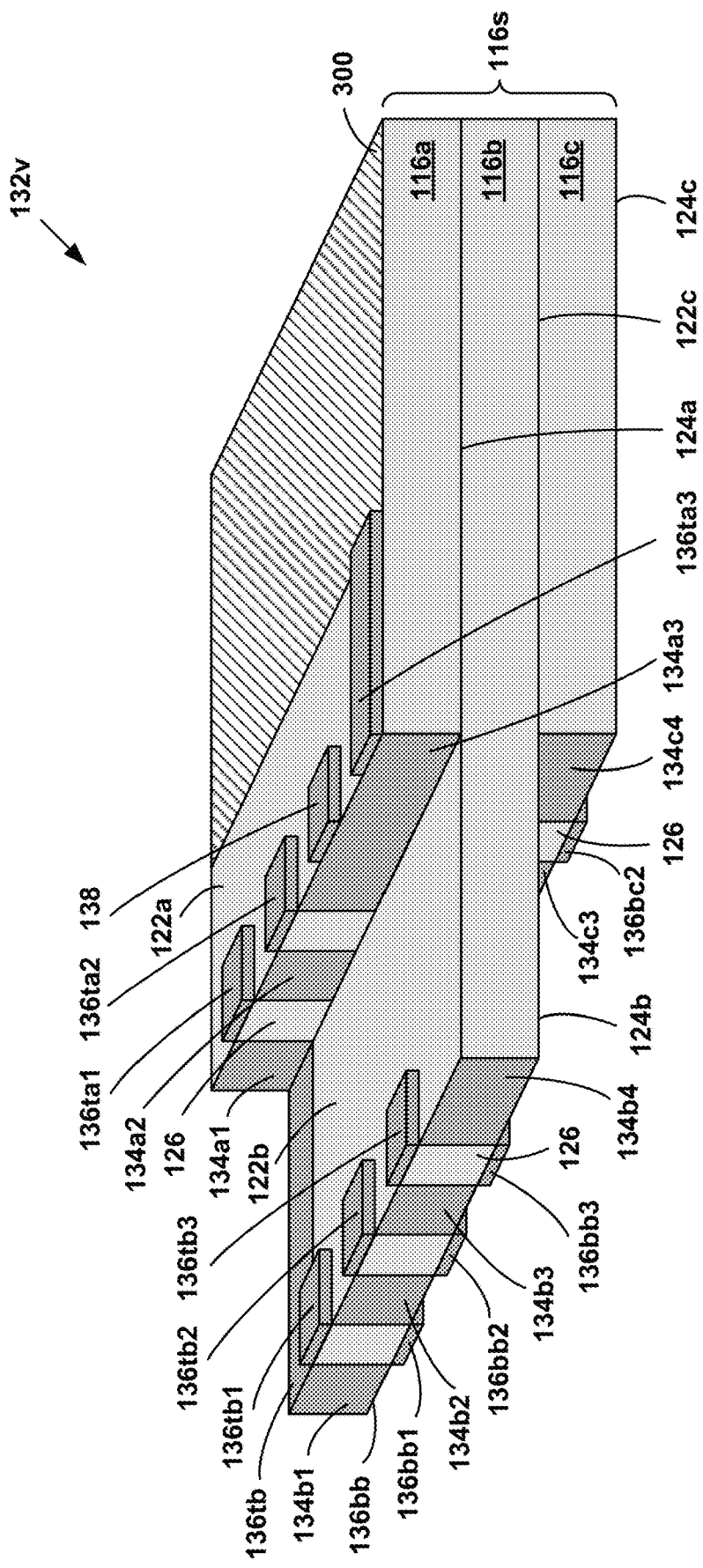

FIG. 2V depicts a twenty-second example embodiment of a side-plated antenna 132*v* disposed on step printed circuit board 116*s*. Side-plated antenna 132*v* is similar to side-plated antenna 132*t* of FIG. 2T, but also includes first conductive plate 300 disposed on top side 122*a* of first printed circuit board layer 116*a*. In embodiments, first conductive plate 300 is an electrically conductive material (e.g., copper or other similar conductive material). In an embodiment, first conductive plate 300 is a ground plane electrically connected to second portion 136*ta*3 to form a ground connection coupled to inverted-F meander structure side-plated antenna 132*v*.

Figure 2W:
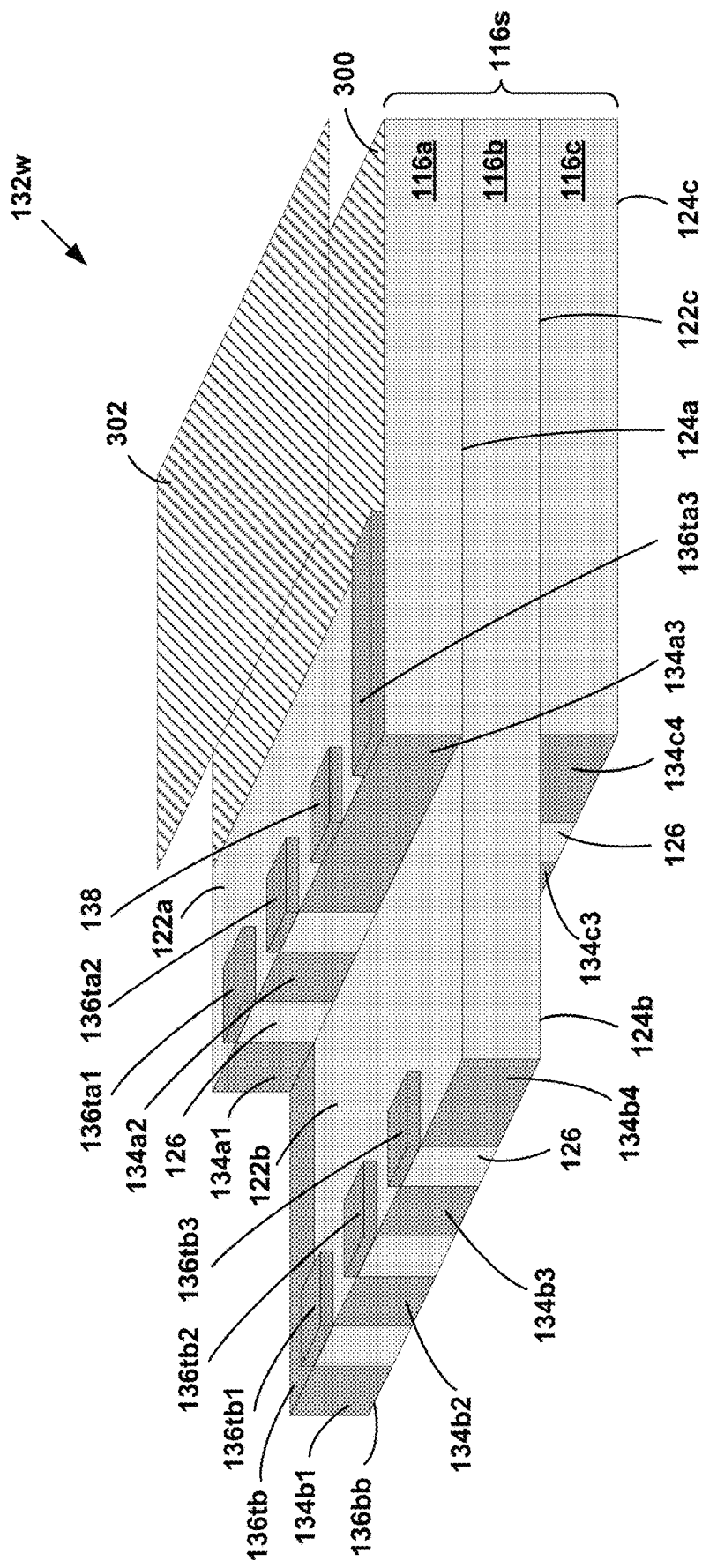

FIG. 2W depicts a twenty-third example embodiment of a side-plated antenna 132*w* disposed on step printed circuit board 116*s*. Side-plated antenna 132*w* is similar to side-plated antenna 132*u* of FIG. 2U, but also includes second conductive plate 302 disposed above first conductive plate 300. In embodiments, second conductive plate 302 is an electrically and/or thermally conductive material (e.g., copper or other similar conductive material). In embodiments, second conductive plate 302 may be used as a heat sink and/or a dedicated ground plane for side-plated antenna 132*w*. In an embodiment, second conductive plate 302 is a dedicated ground plane electrically connected to second portion 136*ta*3 to form a dedicated ground connection coupled to inverted-F meander structure side-plated antenna 132*w*.

Figure 2X:
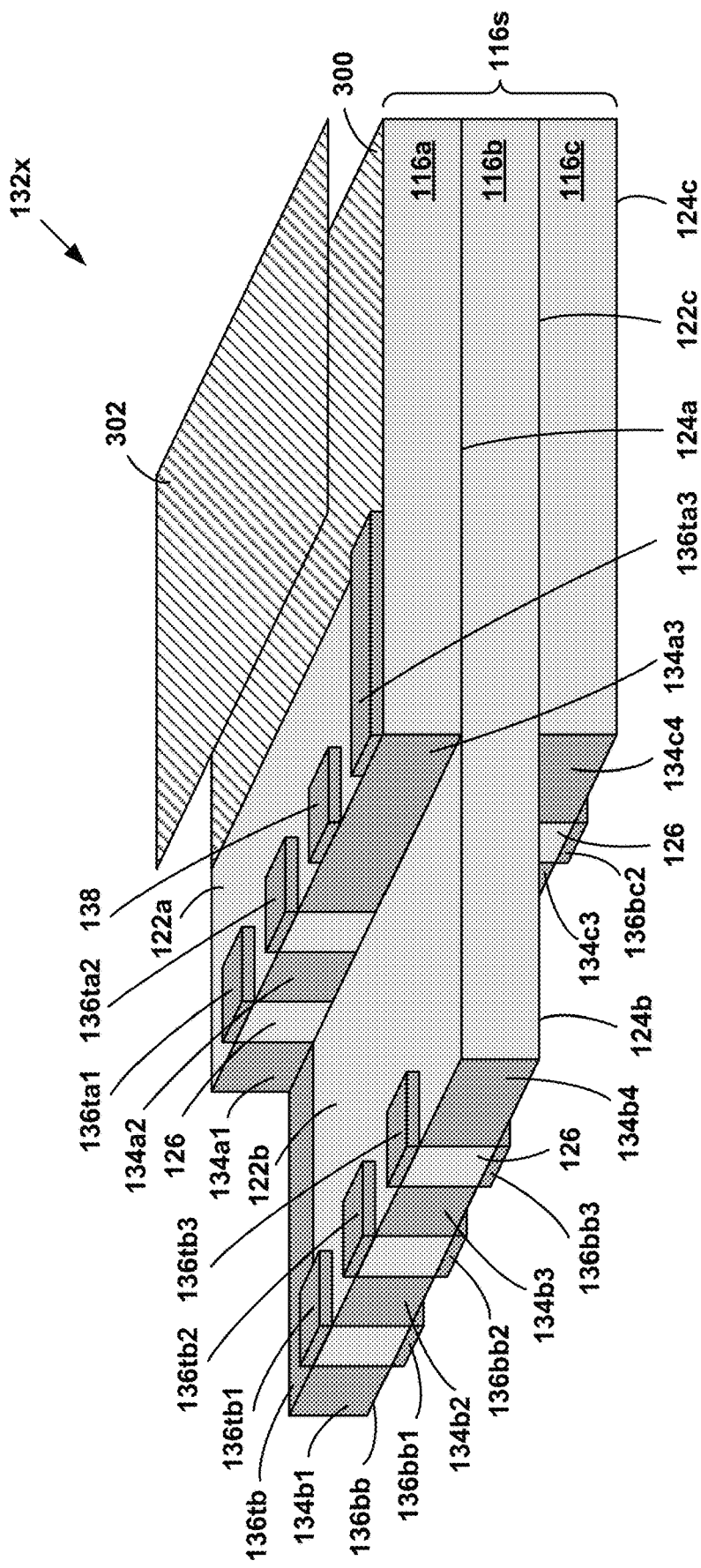

FIG. 2X depicts a twenty-fourth example embodiment of a side-plated antenna 132*x* disposed on step printed circuit board 116*s*. Side-plated antenna 132*x* is similar to side-plated antenna 132*v* of FIG. 2V, but also includes second conductive plate 302 disposed above first conductive plate 300. In embodiments, second conductive plate 302 is an electrically and/or thermally conductive material (e.g., copper or other similar conductive material). In embodiments, second conductive plate 302 may be used as a heat sink and/or a dedicated ground plane for side-plated antenna 132x. In an embodiment, second conductive plate 302 is a dedicated ground plane electrically connected to second portion 136ta3 to form a dedicated ground connection coupled to inverted-F meander structure side-plated antenna 132x.

One embodiment includes an apparatus that includes a portable storage device that includes a first heat sink and a second heat sink, and a printed circuit board disposed between the first heat sink and the second heat sink. The printed circuit board includes a top side, a bottom side, and a peripheral edge disposed between the top side and the bottom side, and a side-plated antenna disposed on the peripheral edge of the printed circuit board. The side-plated antenna is configured to transmit and receive radio frequency signals.

One embodiment includes apparatus that includes a portable storage device that includes a housing and a printed circuit board disposed within the housing. The housing includes a top cover and a bottom cover, each including metal. The printed circuit board includes a peripheral edge substantially perpendicular to the top cover and the bottom cover, and a side-plated antenna disposed on the peripheral edge of the printed circuit board, the side-plated antenna comprising a meander structure and configured to transmit and receive radio frequency signals.

One embodiment includes method that includes forming a plurality of portions of a conductive material on a peripheral edge of a printed circuit board, the peripheral edge disposed between a top side and a bottom side of the printed circuit board, forming a plurality of traces on the top side or the bottom side the printed circuit board, each of the traces electrically connected to a corresponding pair of the portions of the conductive material, forming a radio frequency feed input terminal on the top side or the bottom side of the printed circuit board, the radio frequency feed input terminal coupled to the plurality of portions of a conductive material, and configuring the plurality of portions of a conductive material, the plurality of traces and the radio frequency feed input terminal as a meander structure radio frequency antenna for a portable storage device.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For Purposes of this Document, the Term "Set" of Objects May Refer to a "Set" of One or More of the Objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A portable storage device comprising:
a printed circuit board comprising:
a top side, a bottom side, and a peripheral edge disposed between the top side and the bottom side;
a plurality of portions of a conductive material disposed on the peripheral edge; and
a plurality of equally sized traces disposed in pairs, one portion of each pair disposed on the top side and one portion of each pair disposed on the bottom side, wherein the peripheral edge between each pair is non-conductive material, each of the trace pairs electrically connected to a corresponding pair of the portions of the conductive material,
wherein the plurality of portions of a conductive material and the plurality of traces comprise a meander structure radio frequency antenna that is partially on the peripheral edge and partially on the top side and the bottom side for the portable storage device.

2. The portable storage device of claim 1, wherein the meander structure radio frequency antenna is electroplated on the peripheral edge of the printed circuit board.

3. The portable storage device of claim 1, wherein the meander structure radio frequency antenna comprises a conductive material.

4. The portable storage device of claim 1, further comprising a radio frequency feed input terminal on the top side or the bottom side of the printed circuit board, the radio frequency feed input terminal coupled to the plurality of portions of a conductive material.

5. The portable storage device of claim 1, wherein the meander structure radio frequency antenna comprises an inverted-F antenna.

6. The portable storage device of claim 1, wherein the meander structure radio frequency antenna comprises a monopole antenna.

7. The portable storage device of claim 1, wherein the printed circuit board is disposed between a top cover, a bottom cover, and a side portion, wherein the top cover and the bottom cover each comprise a metal and the side portion comprises a non-metallic material.

8. The portable storage device of claim 7, wherein the side portion comprises a first portion that is substantially parallel to the peripheral edge of the printed circuit board.

9. The portable storage device of claim 7, wherein the side portion comprises a first portion that is substantially perpendicular to the top cover and the bottom cover.

10. The portable storage device of claim 1, wherein the meander structure radio frequency antenna comprises one or more of a Bluetooth Low Energy antenna, a WiFi antenna, and a UHF antenna.

11. A portable storage device comprising:
a housing comprising a top cover and a bottom cover, each comprising metal; and
a printed circuit board disposed within the housing, the printed circuit board comprising:
a top side, a bottom side, and a peripheral edge disposed between the top side and the bottom side, the peripheral edge substantially perpendicular to the top cover and the bottom cover;
a plurality of portions of a conductive material disposed on the peripheral edge; and
a plurality of equally sized traces disposed in pairs, one portion of each pair disposed on the top side and one portion of each pair disposed on the bottom side, wherein the peripheral edge between each pair is non-conductive material, each of the trace pairs electrically connected to a corresponding pair of the portions of the conductive material, wherein the plurality of portions of a conductive material and the plurality of traces comprise a meander structure radio frequency antenna that is partially on the peripheral edge and partially on the top side and the bottom side configured to transmit and receive radio frequency signals.

12. The portable storage device of claim 11, wherein the meander structure radio frequency antenna is electroplated on the peripheral edge of the printed circuit board.

13. The portable storage device of claim 11, wherein the meander structure radio frequency antenna comprises a conductive material.

14. The portable storage device of claim 11, wherein the meander structure radio frequency antenna comprises an inverted-F antenna.

15. The portable storage device of claim 11, wherein the housing further comprises a side portion that comprises a first portion that is substantially parallel to the peripheral edge of the printed circuit board.

16. The portable storage device of claim 11, wherein the first portion is substantially perpendicular to the top cover and the bottom cover.

17. The portable storage device of claim 11, wherein the meander structure radio frequency antenna comprises one or more of a Bluetooth Low Energy antenna, a WiFi antenna, and a UHF antenna.

* * * * *